(12) United States Patent
Siers et al.

(10) Patent No.: US 12,436,467 B2
(45) Date of Patent: Oct. 7, 2025

(54) SIMULATING DIE ROTATION TO MINIMIZE AREA OVERHEAD OF RETICLE STITCHING FOR STACKED DIES

(71) Applicant: Intel Corporation, Santa Clara, CA (US)

(72) Inventors: Scott Siers, Elk Grove, CA (US); Satish Damaraju, El Dorado Hills, CA (US); Christopher Pelto, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 774 days.

(21) Appl. No.: 17/561,524

(22) Filed: Dec. 23, 2021

(65) Prior Publication Data

US 2023/0205094 A1    Jun. 29, 2023

(51) Int. Cl.
  *H01L 23/48*     (2006.01)
  *G03F 7/00*      (2006.01)
  *H01L 23/498*    (2006.01)

(52) U.S. Cl.
  CPC ........ *G03F 7/70475* (2013.01); *H01L 23/481* (2013.01); *H01L 23/49816* (2013.01)

(58) Field of Classification Search
  CPC ............. H01L 23/481; H01L 23/49816; H01L 23/3128; H01L 21/561
  See application file for complete search history.

(56) References Cited

U.S. PATENT DOCUMENTS

| | | | |
|---|---|---|---|
| 11,315,891 B2 * | 4/2022 | Tsai | H01Q 23/00 |
| 11,688,675 B1 * | 6/2023 | Lambrecht | H01L 23/49822 257/668 |
| 11,804,433 B2 * | 10/2023 | Chen | H01L 21/56 |
| 11,855,057 B2 * | 12/2023 | Yu | H01L 23/5389 |
| 2016/0322331 A1 * | 11/2016 | Lim | H01L 25/50 |
| 2019/0006252 A1 * | 1/2019 | Akkinepally | H01L 23/5226 |
| 2022/0344287 A1 * | 10/2022 | Yu | H01L 23/645 |
| 2022/0352082 A1 * | 11/2022 | Yu | H01L 23/5386 |
| 2022/0352092 A1 * | 11/2022 | Chang | H01L 24/80 |
| 2022/0359461 A1 * | 11/2022 | Chang | H01L 25/105 |
| 2023/0065380 A1 * | 3/2023 | Cheah | H01L 25/50 |
| 2023/0102167 A1 * | 3/2023 | Popovic | H01L 23/49816 257/777 |
| 2023/0163098 A1 * | 5/2023 | Elsherbini | H01L 25/0652 257/532 |
| 2023/0170275 A1 * | 6/2023 | Lear | H01L 23/585 |
| 2023/0178513 A1 * | 6/2023 | Jun | H01L 24/24 257/668 |
| 2023/0207504 A1 * | 6/2023 | Shao | H01L 25/50 257/777 |
| 2024/0387485 A1 * | 11/2024 | Lin | H01L 21/6835 |

* cited by examiner

*Primary Examiner* — Thao P Le
(74) *Attorney, Agent, or Firm* — Essential Patents Group, LLP

(57) ABSTRACT

Compute complexes, base dies, and methods related to leveraging reticle stitching for improved device interconnects are discussed. A base die includes first and second regions having device layers, lower level metallization layers, and through vias fabricated using the same reticles. In the first region, a first subset of the through vias are contacted by higher metallization layers and, in the second region, a second distinct subset of the through vias are contacted by higher metallization layers such that the first and second metallization layers provide unique routing through vias having shared layouts and relative locations in the first and second regions.

18 Claims, 14 Drawing Sheets

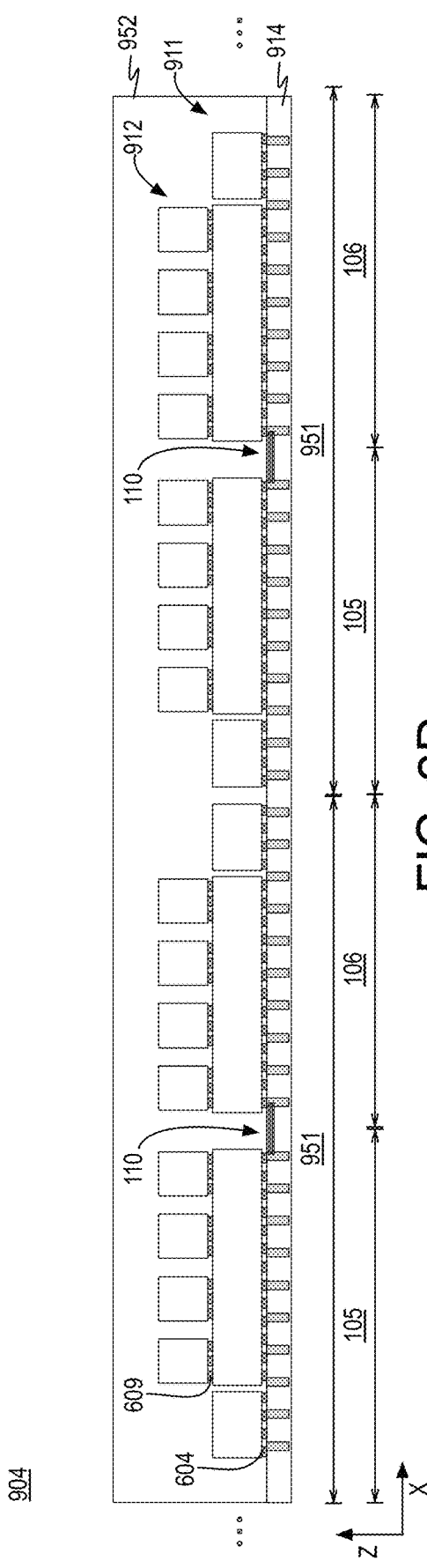
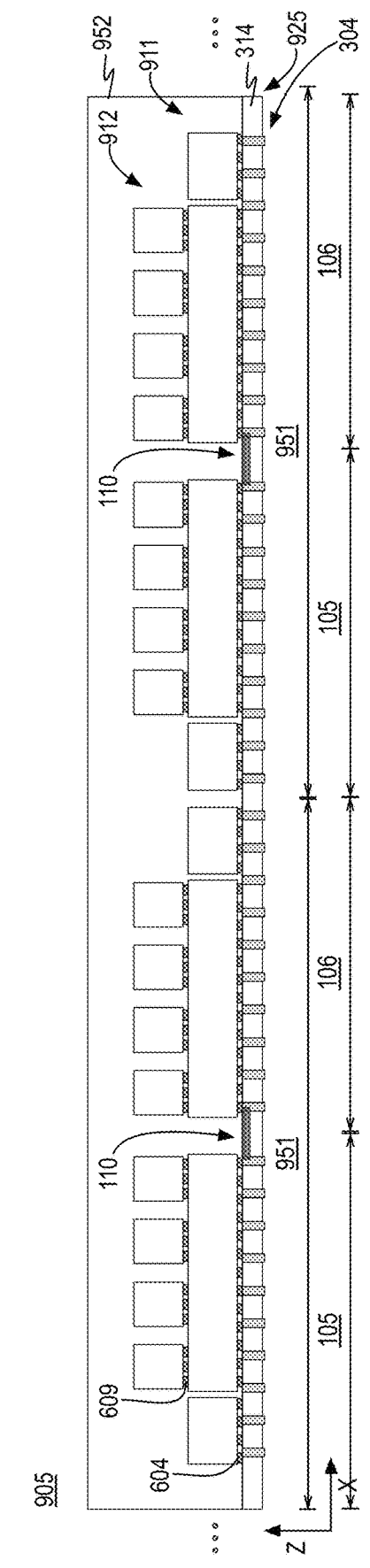

SIMULATING DIE ROTATION TO MINIMIZE AREA OVERHEAD OF RETICLE STITCHING FOR STACKED DIES

BACKGROUND

As the semiconductor industry continues to track to Moore's Law, the number of transistors in the same area continues to double over time. For previous central processing units, the doubling of transistors provided for logic to be added. The added logic was typically used to increase performance while the overall die size remained constant. For graphics processors, particularly discrete graphics processors, the need for increased performance is much greater and hence die sizes have grown and can now exceed a reticle size, which requires communication between various chips or tiles in a compute system or complex. In such contexts, the use of C4 (controlled collapse chip connection) bumps for communication between dies provides very poor bandwidth. Other techniques, such as embedded interconnect bridges (EMIBs) improve bandwidth. However, as the number of execution units and nodes in various processor complexes increases, the bandwidth required also dramatically increases. In some die-to-die communication contexts, EMIB solutions will not be able to provide the necessary bandwidth.

It is with respect to these and other considerations that the present improvements have been needed. Such improvements may become critical as the need to provide high bandwidth between dies or tiles as well as the need to provide flexible communication pathways is necessary to support ever more sophisticated electronics systems and complexes.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 9A, 9B, 9C, 9D, 9E, 9F, and 9G are views of example device structures as particular fabrication operations are performed;

DETAILED DESCRIPTION

Figure 1:
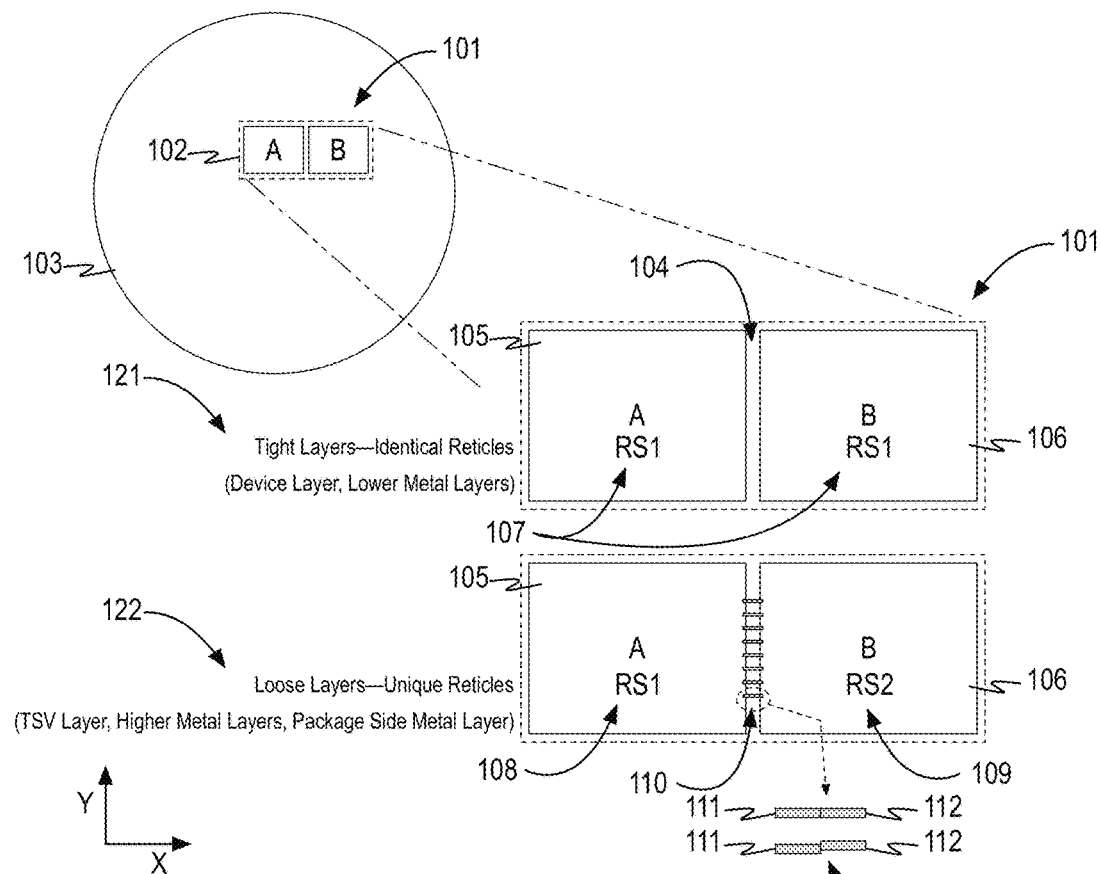
FIG. 1 illustrates an example monolithic base die having layers selectively fabricated using reticle stitching.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized, and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direct contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. The terms "lateral", "laterally adjacent" and similar terms indicate two or more components are aligned along a plane orthogonal to a vertical direction of an overall structure. Herein, the term "predominantly" indicates not less than 50% of a particular material or component while the term "substantially pure" indicates not less than 99% of the particular material or component. Unless otherwise indicated, such material percentages are based on atomic percentage. As used herein, the terms "monolithic", "monolithically integrated", and similar terms indicate the components of the monolithic overall structure form a indivisible whole not reasonably capable of being separated.

Metal interconnect structures, integrated circuits, and techniques are described herein related to reticle stitching for advanced compute complexes including through silicon via sets that may be adaptably used for variable interconnections.

As discussed, as the number of execution units and nodes in various processor or compute complexes increases, the bandwidth required between components of the complex also dramatically increases. For example, in comparison to embedded interconnect bridges, compute complexes can require a 3× bandwidth increase between regions of a base die. In some embodiments, reticle stitching techniques are deployed between regions of a monolithic base die. As used herein, the term reticle stitching indicates different regions of a monolithic base die (e.g., an indivisible die structure over an un-diced substrate) are patterned separately but have components such as metal lines that are coupled. The term metal line indicates a continuous metal conductor such as a wire embedded in dielectric material. Separate patterning for the base die uses the same reticles for some layers of two different regions and different reticles for other layers of the two different regions, as discussed further herein. In prior applications, when multiple base dies were employed, systems need rotation or mirroring of the base dies such that I/Os (input/output) on the base dies could communicate across a common edge between the dies.

In contrast, the systems discussed herein employ a single monolithic base die fabricated using reticle stitching techniques for some layers. The reticle stitching techniques deployed herein can efficiently mimic such rotation and mirroring of base dies on the same single monolithic base die by patterning sets of through silicon vias in different regions of the base die such that the sets of through silicon vias have same relative location and, optionally, the same layout, in the regions of the single monolithic base die. In some embodiments, the through silicon vias can be patterned using the same reticle for both regions of the single monolithic base die. Metallization layers of a first region can then access particular ones of the through silicon vias of the first region for use in a particular application (e.g., pass through connectivity only, or others) while metallization layers of a second region access other particular ones of the through silicon vias of the second region for use in a different application (e.g., device driven connectivity, or others). Notably, the through silicon vias used in the first region and the through silicon vias used in the second region are different such that none of them are collocated. As used herein, the term collocated indicates through silicon vias that would be in the same position if the sets through silicon vias were overlapped. For example, collocated through silicon vias are in the same relative position within regions of the single monolithic base die. As used herein, the term relative position indicates a position relative to a particular feature of a region (i.e., a top left corner of a region, a center of region, etc.).

For example, herein, loose pitch layers are defined as those layers of the base die where reticle stitching is deployed. Such layers use different reticles for each region of the base die. Tight pitch layers are defined as layers of the base die where reticle stitching is not or cannot be deployed (i.e., due to difficulties or limitations in stitching at the dimensions used by such layers). In tight pitch layers, the same reticles are used for each region of the base die. In some compute complexes, memory (i.e., cross-bar memory, advanced memory, or others) is on the middle of each region of the base die and edges regions are where I/O features are populated. In shared edges between regions of the base die, active communication between the regions of the base die may be deployed. On edges of the regions on exposed edges of the base die, data can be passed through (e.g., passively passed) the base die either to an embedded interconnect bridge or to a package substrate (e.g., to package pins). The techniques discussed herein utilize through silicon vias (e.g., a TSV layer) that have sets of through silicon vias that can be selectively contacted by higher level loose pitch metallization layers. In some embodiments, the TSV layer is deployed as a loose pitch layer. Thereby, previous rotation and mirroring of base dies may be emulated for efficient base die area usage and high performance compute complexes.

FIG. 1 illustrates an example monolithic base die 101 having layers selectively fabricated using reticle stitching, arranged in accordance with at least some implementations of the present disclosure. As shown, base die 101 may be singulated from substrate wafer 103 using scribe cuts 102 that surround base die 101 but do not intersect between regions 105, 106 (also labeled as A and B) of base die 101 such that regions 105, 106 correspond to areas patterned separately using a reticle and lithography exposure. As used herein, the term base die indicates a die onto which other dies or chiplets are mounted in a system. Regions 105, 106 may also be characterized as tiles. Such tiles or regions 105, 106 are patterned in separate lithography exposures. For example, base die 101 has a size that is greater than the area provided by one reticle exposure (e.g., greater than about 33 mm×26 mm). Such exposures may include features that are to be connected across regions 105, 106 (loose pitch layers) or not (tight pitch layers). When no features are to be connected across regions 105, 106, it is advantageous for regions 105, 106 to be patterned using the same reticle sets. As used herein, the term reticle set indicates a set of reticles used to pattern a region, each reticle for a layer of the region. When the same reticle sets are used, the same features (i.e., devices, metallization layers) are fabricated. When different reticle sets are used, different features are fabricated.

As discussed, when the layers are tight pitched layers, no features are connected across regions 105, 106 and the same reticles are used for patterning regions 105, 106. When the layers are loose pitched layers, features may connect across regions 105, 106 and different reticles are used for patterning regions 105, 106. As shown, in some embodiments, such tight pitch layers 121 include device layers and lower level metal layers. As used herein, a device layer indicates a layer having active devices such as transistors, memory devices, capacitors, resistors, optoelectronic devices, switches, or any other active or passive electronic devices, or portions thereof. Lower level metal layers indicate metallization layers (e.g., via layers and metal line layers) closest to the device layer. For example, lower level metal layers may include 6 back end metallization layers, although other numbers of layers may be deployed as lower level metal layers. In some embodiments, loose pitch layers 122 include a through silicon via (TSV) layer, higher metal layers on the front side of base die 101 (i.e., higher back end of line metal layers) and one or more package side metal layers. A through silicon via layer indicates a layer of through silicon vias that extend across (or bypass) the lower level metal layers and the device layer. As the name indicates, the through silicon vias extend from a point in the metal layers to beyond the device layer (i.e., below the device layer). The term higher level metal layer indicates metallization layers (e.g., via layers and metal line layers) farther from the device layer and, for example, above the through silicon via layer. A package side metal layer indicates a metallization layer (i.e., a metal line layer) formed on an opposite side of the device layer from the lower and higher level metal layers. For example, the TSV layer is a loose pitch layer with TSVs in the exact same locations in region 105 or region 106 and, optionally, having the same layouts (though the restriction of tight pitch layers are not applied to the TSV layer). Such TSV matching locations and, optionally, layouts provides a variety of advantages as discussed herein.

As shown in FIG. 1, the patterning of tight pitch layers 121 in both of regions 105, 106 is performed using a shared reticle set 107 (RS1). Shared reticle set 107 is used for patterning both of regions 105, 106 and no connections (as indicated by isolation 104 between regions 105, 106) are provided. In contrast, the patterning of loose pitch layers 122 is performed by patterning region 105 with a first reticle set 108 (RS1) and region 106 with a second reticle set 109 (RS2) different than first reticle set 108. Herein, two reticle sets are different when at least one reticle between the two sets is different. Notably, such different reticle sets provide for different TSV layers, higher metal layers, and/or package side metal layers between regions 105, 106, while implementation of shared reticle set 107 on both of regions 105, 106 means the same features are patterned on both of regions 105, 106. For example, the device layer and lower metal layers are the same (within processing variability) while the TSV layers, higher metal layers, and package side metal layer may be different.

As shown, for loose pitch layers 122, reticle stitched metal lines 110 may be provided between regions 105, 106. Such reticle stitched metal lines 110 are used for communication between regions 105, 106 of base die 101, and between components coupled to base die 101. As used herein, the term reticle stitched metal line indicates a continuous metal line having a first metal line 111 (or portion of a metal line) patterned using a first lithographic exposure and a second metal line 112 (or portion of a metal line) patterned using a second lithographic exposure (and second reticle pattern). For example, continuous metal lines of base die 101 include first metal lines of region 105 connected to second metal lines of region 106. As shown, an offset 113 may be provided between first metal line 111 and second metal line 112 due to registration error and/or distortion in the two distinct patterning processes (e.g., different photolithography images). For example, portions of reticle stitched metal lines 110 may be implemented in the scribe line of a pattern from a traditional reticle.

As discussed, in prior compute complexes, two (or more) base dies are deployed and communication between the base dies is limited to C4 connections or embedded interconnect bridge connections, with embedded interconnect bridge connections being preferred. Such embedded interconnect bridge connections, however, are limited to about 55 um pitch such that about 341 signals/mm of edge (e.g., shoreline) at about 6 GT can be used, for a total of 255 GB of bandwidth/mm. Furthermore, the shoreline is limited in such applications. Using a single base die having regions coupled by metal lines fabricated using reticle stitching, digital logic can be deployed at lower pitches such as <360 nm pitches with 4000 signals/mm and, although running at a slower rate (e.g., 2 GT), greater overall bandwidth of about 1000 GM/m, or an increase of 3× or more. Other advantages will be evident from the following discussion.

As discussed further below, the techniques discussed herein create an identical box (or portion) where two different connections (e.g., top chiplet connections) either from silicon interposer bumps to package side bumps or from silicon interposer bumps to regular logic are identical for layers required to be identical based on pitch and move distinguishing routing to looser pitch layers that can be varied. Using such techniques, the only wasted area is the difference between the 2 connection types and rotation and mirroring may be emulated.

Figure 2:
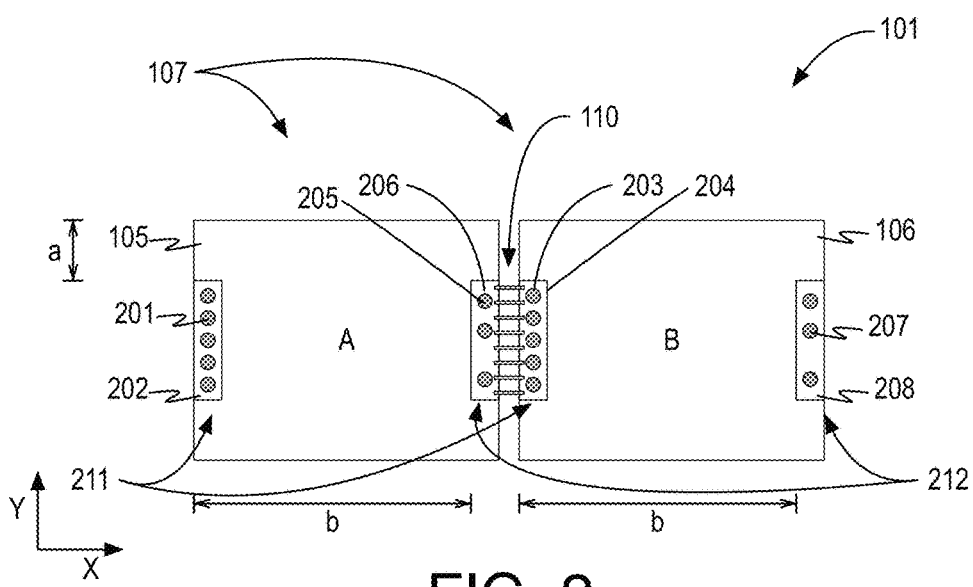
FIG. 2 illustrates example reticle stitched metal lines and matching through silicon via portions of example monolithic base die.

FIG. 2 illustrates example reticle stitched metal lines and matching through silicon via portions of example monolithic base die 101, arranged in accordance with at least some implementations of the present disclosure. As discussed, monolithic base die 101 includes region 105 and region 106 such that regions 105, 106 have shared patterns for a device layer and a number of lower metallization layers (e.g., tight pitch layers 121). Furthermore, base die 101 includes metal lines 110 that connect regions 105, 106 such that metal lines 110 are a part of one or more of higher metallization layers or a package side metal layer.

As shown in FIG. 2, monolithic base die 101 also includes through silicon vias 201 in a portion 202 of region 105 and through silicon vias 203 in a portion 204 of region 106 such that through silicon vias 201 and through silicon vias 203 have the same relative positions 211 within regions 105, 106. In some embodiments, through silicon vias 201 and through silicon vias 203 also have a same layout 211. As discussed with respect to FIG. 3, through silicon vias 201, 203, 205, 207 extend vertically (i.e., in the z-direction) across device layers and lower level metallization layers without contacting such layers. As used herein, the term same layout indicates the sizes and locations of the components are the same in plan view (i.e., x-y plane). The term same relative positions indicates the positions are the same relative to a particular characteristic of regions 105, 106. For example, from a top left corner of region 105, portion 202 of through silicon vias 203 may be located at 0 in the x-direction (i.e., along a left edge of region 105) and −a in the y-direction (i.e., a distance a from a top edge of region 105). Since portion 204 is at the same relative position, from a top left corner of region 106, it is located 0 in the x-direction (i.e., along a left edge of region 106) and −a in the y-direction (i.e., a distance a from a top edge of region 106). The same holds for each of through silicon vias 201 and corresponding ones of through silicon vias 203, subject to minor variations due to fabrication constraints.

In the same manner, through silicon vias 205 in a portion 206 of region 105 and through silicon vias 207 in a portion 208 of region 106 have the same relative positions 212 within regions 105, 106. In some embodiments, through silicon vias 205 in portion 206 of region 105 and through silicon vias 207 in portion 208 of region 106 also have a same layout 212. As shown, in some embodiments, the layouts of through silicon vias 201, 203 are the same, as are the layouts of through silicon vias 205, 207. However, the layouts of through silicon vias 201 and through silicon vias 205 may be different. In other embodiments, the layouts of through silicon vias 201 and through silicon vias 203 and/or the layouts of through silicon vias 205 and through silicon vias 207 may be different. For example, if connection is not made to one or more through silicon vias, they may be selectively depopulated. Again using top left corners of regions 105, 106 as a common feature, portion 206 of through silicon vias 205 may be located at +b in the x-direction (i.e., a distance b from a left edge of region 105) and −a in the y-direction (i.e., a distance a from a top edge of region 105). Since portion 208 is at the same relative position, from a top left corner of region 106, portion 208 is located +b in the x-direction (i.e., a distance b from a left edge of region 106) and −a in the y-direction (i.e., a distance a from a top edge of region 106). The same again holds for each of through silicon vias 205 and corresponding ones of through silicon vias 207 when matching layouts are used.

In the illustrated embodiment, portion 202 of region 105 is on a left edge of base die 101, portion 206 of region 105 is on an opposite right edge of region 105 within an interior of base die 101 (i.e., near or adjacent reticle stitched metal lines 110), portion 204 of region 106 is on a left edge of region 106 within the interior of base die 101, and portion 208 of region 106 is on a right edge of base die 101 opposite the left edge of base die 101. Such locations may facilitate communication at lateral edges of base die 101 and within the interior of base die 101. However, such matched locations may be at any locations of regions 105, 106 such as at top edges of regions 105, 106, bottom edges of regions 105, 106, corners of regions 105, 106, or the like.

As discussed, such relative locations and, optionally, shared layouts of through silicon vias may be leveraged for improved performance of base die 101.

Furthermore, unshared patterns of metallization layers above and contacting such through silicon vias 201, 205, 203, 207 are used to selectively connect to individual ones of through silicon vias 201, 205, 203, 207. For example, in portion 202, connection may be made from the metallization layers to particular ones of through silicon vias 201. In contrast, in portion 204, metallization layers connect to other ones of through silicon vias 203 (i.e., such that region 105 metallization and region 106 metallization do not contact collocated vias between vias 201, 203). As used herein, collocated vias indicate vias having the same relative positions within regions 105, 106.

Such selective through silicon via routing and reticle stitched metal lines 110 interconnecting regions 105, 106 provides high bandwidth coupling between regions 105, 106 and flexibility in connecting different interconnections, protocols, etc. to a shared through silicon via pattern. That is, different connections can be made to matched vias 201, 203. Similarly, different connections can be made to matched vias 205, 207.

Figure 3:
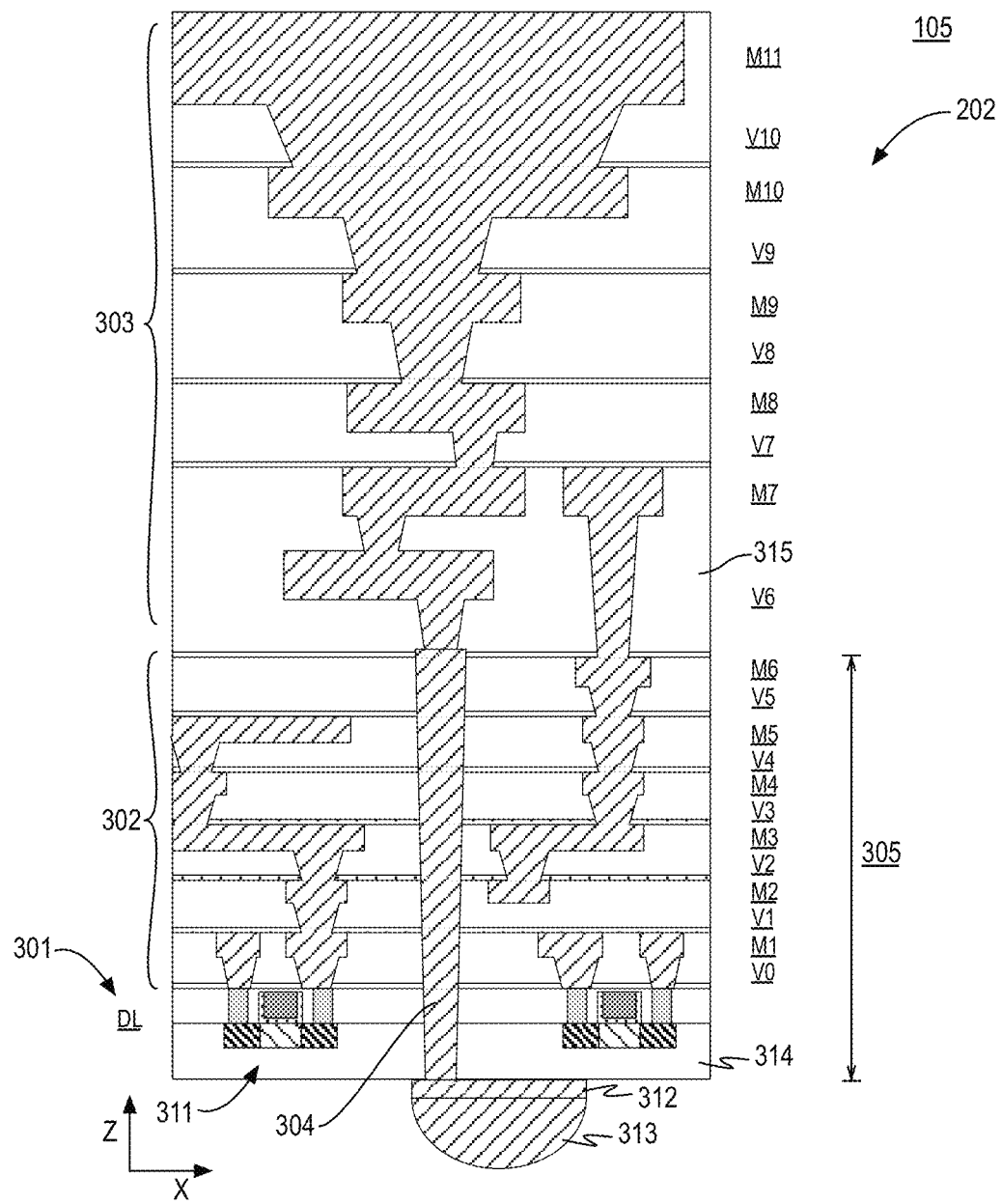
FIG. 3 provides a cross-sectional view of an exemplary portion of a first region of a monolithic base die.

FIG. 3 provides a cross-sectional view of an exemplary portion 202 of first region 105 of monolithic base die 101, arranged in accordance with at least some implementations of the present disclosure. As shown, base die 101 includes a substrate 314, which may have a lateral surface along the x-y plane. Substrate 314 may be any material known to be suitable for the fabrication of device circuitry. In the illustrated example, planar transistors 311 are formed on and/or within substrate 314 such that planar transistors 311 are part of a device layer 301. Device layer may include any active devices such as transistors, memory devices, capacitors, resistors, optoelectronic devices, or switches.

Transistors 311 interconnection, routing to an outside device (not shown), routing within base die 101, routing through base die 101, etc. is provided by metallization layers 302, 303 and through silicon vias 304. Metallization layers 302, 303 include lower level metallization layers 302 and higher level metallization layers 303. In the illustrated example, lower level metallization layers 302 include V0-M6 and higher level metallization layers 303 include V6-M11, however any such metallization layers may be deployed. As discussed, loose pitched layers (i.e., those that do not share reticles and may deploy reticle stitching) may begin after device layer 301 and lower level metallization layers 302. That is, loose pitched layers may include through silicon vias 304 and higher level metallization layers 303. In the illustrated example, such layers loose pitched layers metallization layers begin at V6. However, the loose pitched layers may begin at any suitable metallization such as V7 or others. The metal line stitching discussed herein may be deployed using any one or more of higher level metallization layers 303 and/or package side metallization 312. Device layer 301 and metallization layers 302, 303 may be embedded in dielectric material 315.

As shown, exemplary through silicon via 304 bypasses 305 device layer 301 and lower level metallization layers 302 such that through silicon via 304 does not connect to any of devices or metallizations of device layer 301 and lower level metallization layers 302. For example, through silicon via 304 may be formed in a window between such devices and metallization features. As discussed, device layer 301, lower level metallization layers 302, and through silicon vias 304 of portion 202 are formed using the same reticles (e.g., patterns) as used to form corresponding components in portion 204.

Figure 4:
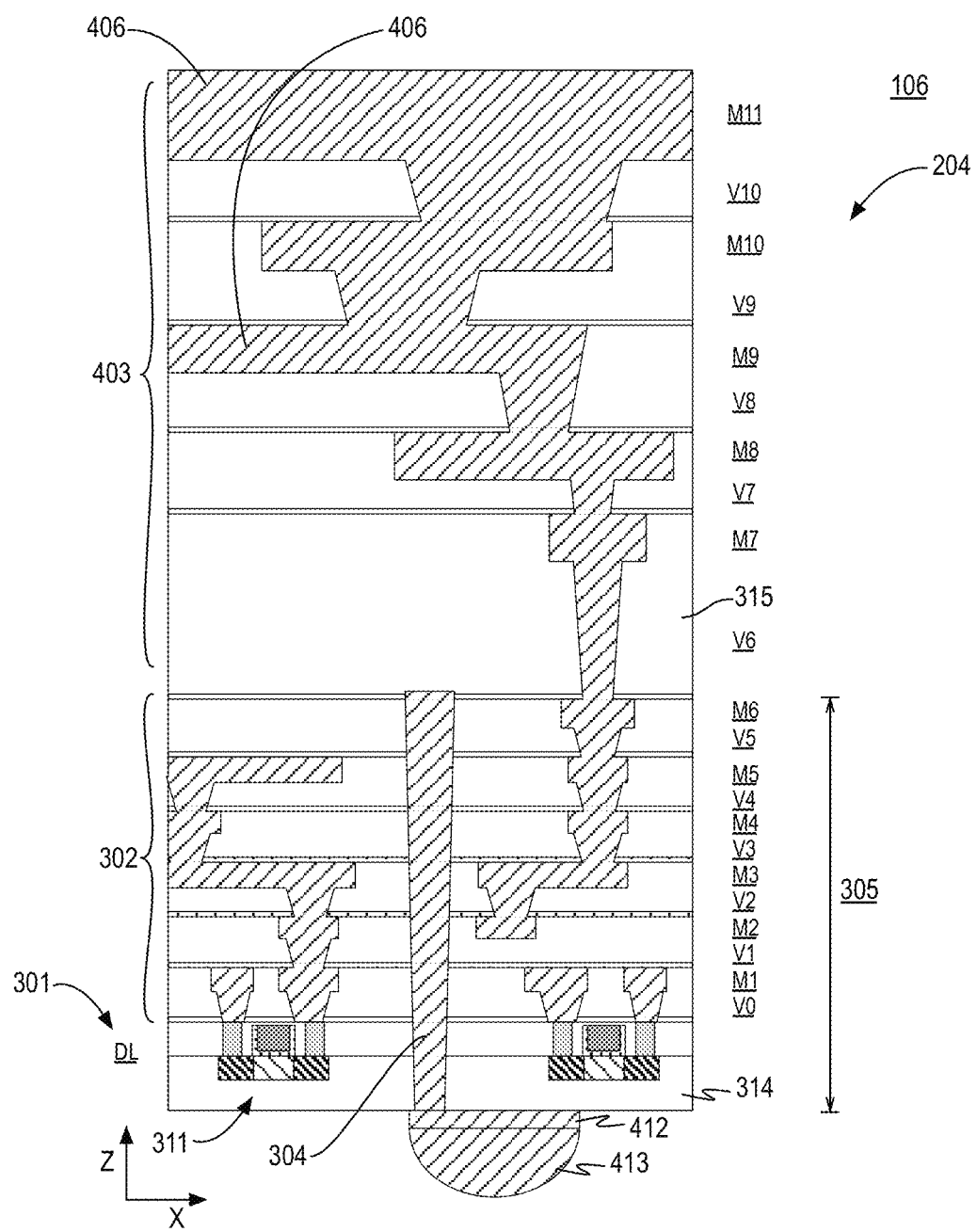
FIG. 4 provides a cross-sectional view of an exemplary portion of a second region of a monolithic base die.

FIG. 4 provides a cross-sectional view of an exemplary portion 204 of second region 106 of monolithic base die 101, arranged in accordance with at least some implementations of the present disclosure. Notably, portions 202, 204 are at the same relative positions within regions 105, 106. As with portion 202, base die 101 includes device layer 301, lower level metallization layers 302, and through silicon vias 304. For example, such features or components may match between portions 202, 204. Notably, through silicon vias 304 may be in the same location if deployed in both reticles (i.e., patterns) used to form the through silicon vias. In other embodiments, through silicon via 304 may be removed in that location. However, with reference to both FIGS. 3 and 4, portion 202 has higher level metallization layers 303 that do not match higher level metallization layers 403 of portion 204. For example, higher level metallization layers 303 and higher level metallization layers 403 are fabricated using different reticles (i.e., patterns). Similarly, package side metallization 312 of portion 202 may not match package side metallization 412 of portion 204 as such package side metallizations may be fabricated using different reticles (i.e., patterns). Package side bumps 313 and package side bumps 413 may be provided in the same or different locations in portion 202 and portion 204.

For example, in the context of portion 202, as shown in FIG. 3, passive through coupling may be provided through portion 202 by routing through higher level metallization layers 303, to through silicon via 304, and to package side bump 413. In such contexts transistor 311 and other devices in portion 202 may be dummy devices that are not functionally coupled by higher level metallization layers 303. In contrast, in portion 204, through silicon via 304 is not contacted by higher level metallization layers 403 (or through silicon via 304 may be removed). Other through silicon vias (not shown) in portion 204 or elsewhere in region 106 are contacted by higher level metallization layers 403 to provide different interconnection and routing. In some embodiments, devices of device layer 301 may be coupled through higher level metallization layers 403 to drive communications routed through portion 204. As shown in FIG. 4, one or more metal lines 406 may route from portion 204 of region 106 to region 105 to provide reticle stitched metal lines 110.

Figure 5:
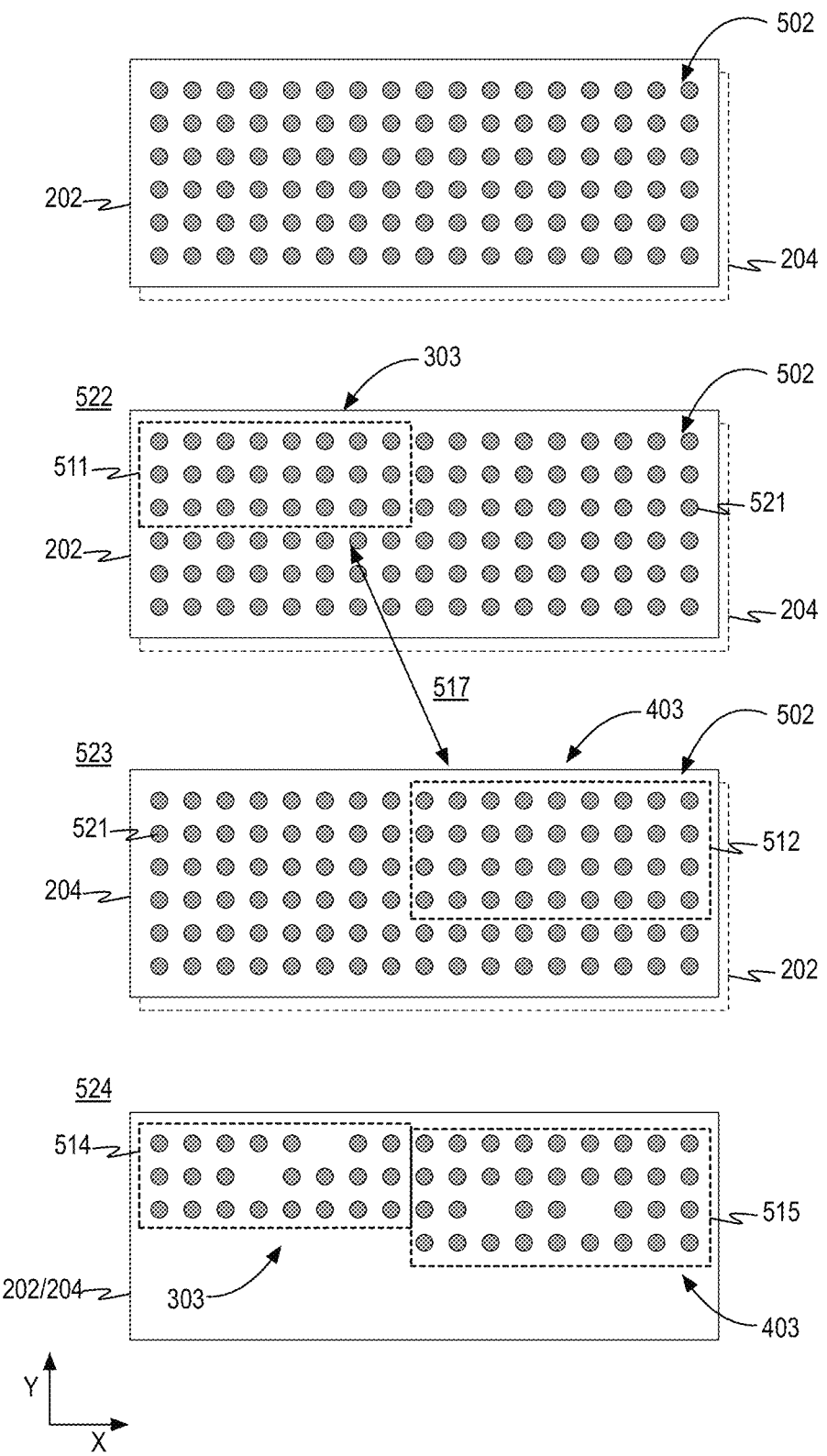
FIG. 5 provides top-down views of exemplary matched through silicon via layouts and differential metallization layer contacts thereto.

FIG. 5 provides top-down views of exemplary matched through silicon via layouts and differential metallization layer contacts thereto, arranged in accordance with at least some implementations of the present disclosure. In FIG. 5, selected ones of available vias as contacted by metallization layers 303, 403 in portions 202, 204, respectively, are illustrated. For example, such portions 202, 204 of available through silicon vias 201, 203 may have any suitable through silicon via layout. The through silicon via layouts may be implemented via any matched ones of portions 202, 204 or portions 206, 208, for example. Notably, through silicon vias 201 (in portion 202) and through silicon vias 203 (in portion 204), when overlaid with one another have a matching location and may have matching through silicon via pattern 502 (or 211, see FIG. 2). In the example of through silicon via pattern 502, the through silicon vias are provided as a grid of through silicon vias equally spaced in the x- and y-directions. It is noted that such patterning provides flexibility for design changes to the selected ones of the through silicon vias utilized in implementation. However, other patterns may be used such as different x- and y-pitches, other patterns, or use of different non-uniform patterns. In some embodiments, through silicon vias not used in a portion may be depopulated and unused. In some embodiments, they may remain.

As shown with respect to first via selection 522, in some embodiments, in portion 202, subset of through silicon vias 511 are contacted out of all available through silicon vias 521 in portion 202. For example, subset of through silicon vias 511 may be contacted by metallization layers 303. Although illustrated with respect to a group of neighboring subset of through silicon vias 511 being used, for the sake of clarity of presentation, subset of through silicon vias 511 may be interspersed throughout available through silicon vias 521. Furthermore, as shown with respect to second via selection 523, in portion 204, subset of through silicon vias 512 are contacted out of all available through silicon vias 521 in portion 202. For example, subset of through silicon vias 512 may be contacted by metallization layers 403. Notably, as shown with respect to comparison 517, subset of through silicon vias 511 and subset of through silicon vias 512 do not share any collocated vias. As shown, in some embodiments, not all of available ones of through silicon via pattern 502 are used between subsets of through silicon vias 511, 512. In some embodiments, all such available through silicon vias are used between subsets of through silicon vias 511, 512. Such techniques offer the greatest reduction in area used by through silicon via pattern 502 at the cost of loss of flexibility in making design changes.

As shown with respect to via selections 524 (with portions 202, 204 sections shown in the same view), in some embodiments, only used through silicon vias 514, 515 are provided in matching through silicon via pattern 502. Such techniques may advantageously reduce the size of portions 202, 204 and limit the number of through silicon vias employed. Other layouts, distributions of via selections and the like may be used.

Figure 6:
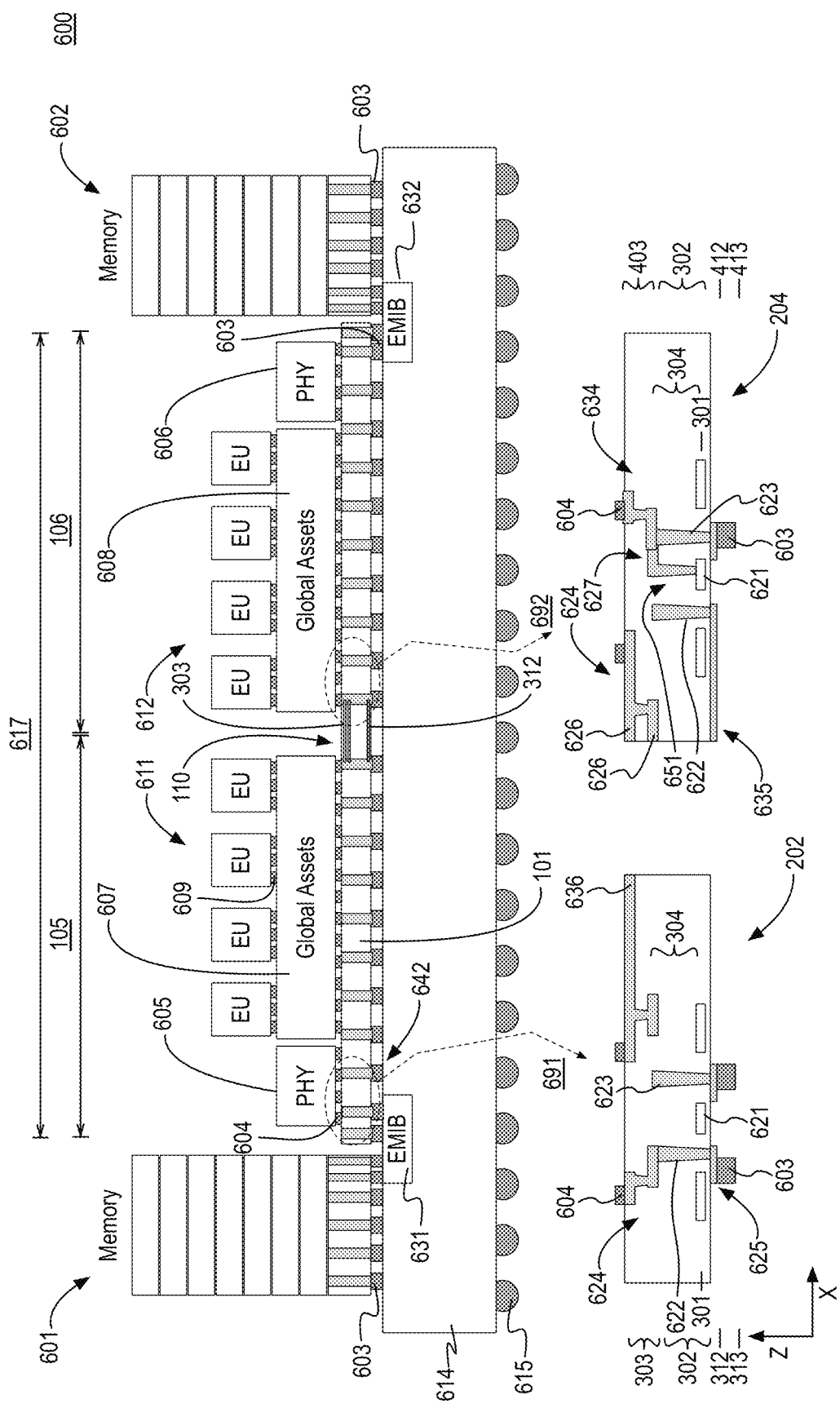
FIG. 6 provides a cross-sectional view of an exemplary compute complex employing a monolithic base die having layers selectively fabricated using reticle stitching.

FIG. 6 provides a cross-sectional view of an exemplary compute complex 600 employing monolithic base die 101 having layers selectively fabricated using reticle stitching, arranged in accordance with at least some implementations of the present disclosure. As used herein, the term compute complex 600 indicates a packaged device that provides compute resources such as graphics processing, visual processing, artificial intelligence processing, or the like using a variety of dies, chiplets, interconnections, etc. As used herein, the term chiplet indicates a die that performs a limited number of functions. The term chiplet may be interchanged with the term die. As shown in FIG. 6, base die 101 may be mounted to a package substrate 614 via package side bumps 603 (microbumps). In the context of compute complex 600, base die 101 may provide memory and compute functions such as address mapping and management, data routing, instructions routing, and so on. Package substrate 614 further includes bumps 615 for connection to a motherboard or other substrate. Memory components 601, 602 are coupled to package substrate 614 via package side bumps 603. Memory components 601, 602 provide memory (e.g., high bandwidth memory) for compute complex 600. Base die 101 is coupled to memory components 601, 602 by embedded interconnect bridges (EMIB) 631, 632, respectively, which are embedded in package substrate 614.

Memory PHY chiplets 605 (e.g., memory interface and controllers), 606 are mounted on edges of base die 101 and coupled to base die 101 by microbumps 604 (e.g., silicon interposer bumps). Memory PHY chiplets 605, 606 provide interface and controls for memory components 601, 602. Memory PHY chiplets 605, 606 may also be characterized as memory controllers. Global assets chiplets 607, 608 are mounted on center regions of base die 101 and coupled to base die 101 by microbumps 604. Global assets chiplets 607, 608 provide a variety of functions for compute complex 600.

For example, global assets chiplets 607, 608 may include interconnections, crossbar functionality, media compute resources, and others. Execution units 611, 612 are mounted on global assets chiplets 607, 608 and coupled thereto by microbumps 609. Execution units 611, 612 provide compute resources for compute complex 600. For example, execution units 611, 612 may be graphics processor execution units or other data sub-slice processors. As shown, base die 101 provides a span 617 for interconnection of the components of compute complex 600 such that regions 105, 106 are within span 617. Notably, absent a reticle stitched base die 101 having reticle stitched metal lines 110, multiple base die may be needed and the connection therebetween (i.e., in place of stitched metal lines 110) may not provide adequate bandwidth for compute complex 600.

As shown with respect to expanded views 691, 692, portions 202 and 204 again include matching device layers 621 and lower level metallization layers inclusive of lower level metallization features 651. However, between portions 202, 204, through silicon vias 622, 623, higher level metallization layers and a package side metallization layer may differ due to use of different masks in their fabrications. Notably, in portion 202, in some embodiments, connection is not made to through silicon via 623 nor is connection made to device layer 621. For example, portion 202 may provide a complete pass through connection from memory PHY chiplet 605 to embedded interconnect bridge 631. For example, one of microbumps 604 connects to higher level metallization layers 624, which in turn connects to through silicon via 622. Through silicon via 622 connects to package side metal 625, which then connects to one of package side bumps 603. As shown, package side bumps 603 may have a tighter pitch (e.g., about 55 um) when coupling to embedded interconnect bridges EMIB 631, 632 and a larger or looser pitch (e.g., about 100+ um) when coupling directly to package substrate 614. For example, a complete pass through connection is provided from memory PHY chiplet 605 to embedded interconnect bridge 631 and then to memory component 601. For example, communication to memory components 601, 602 via base die 101 may be entirely pass-through with all logic for such communication and interfacing performed by middle-tier logic such as logic provided by memory PHY chiplets 605, 606. In some embodiments, metallization layers 624 (or 303) are coupled to memory PHY chiplet 605 and the through silicon vias contacted by metallization layers 624 (or 303) provide a passive connection or coupling from memory PHY chiplet 605 through base die 101 with the through silicon vias coupled to embedded interconnect bridge 631.

Notably, a similar passive connection 642 may be provided to package substrate 614 via high level metallization layers and a through silicon via. For example, direct passive interconnection may be provided from microbumps 604 (i.e., silicon interposer bumps) to higher level metallization layers 303 to through silicon vias 304 to package side metallization 312 to package side bump 313. Package side bump 313 optionally connects to embedded interconnect bridge 631.

In contrast, although using the same device layers 621 and lower level metallization layers inclusive of lower level metallization features 651, portion 204 provides a different connection capability and protocol. As shown with respect to expanded view 692, die-to-die coupling between any of execution units 611, 612, global assets chiplets 607, 608, etc. is provided by reticle stitched metal lines 110. Notably, such coupling is not a pass through connection but is instead driven by devices of device layers 621 (i.e., logic of base die 101). For example, logic of device layers 621 drives communication through reticle stitched metal lines 110. In some embodiments, one or more of such devices are connected to higher level metallization features 627 of higher level metallization layers to drive connection across metal lines 626 that couple regions 105, 106. Such interconnections include other through silicon vias such as through silicon via 623 (that are not employed in portion 202). Furthermore, metal lines 635 of package side metallization may be utilized to couple regions 105, 106 as discussed herein.

By having shared positions and, optionally, layouts of through silicon vias in portions 202, 204 and selectively connecting to them using higher level metallization layers that also connect between regions 105, 106, different connections and communications protocols can be deployed in portions 202, 204. Such advantages are provided only at the cost of the difference in areas between portions 202, 204 without having to duplicate entire functional portions for such different connections and communications protocols. For example, metallization layers 634 (or 403) are coupled to other available through silicon vias. Furthermore, metallization layers 634 (or 403) are coupled to devices of device layers 621 in portion 204 such that the devices are to drive communication from metal lines of metallization layers 634 (or 403) to metal lines such as metal line 636 of metallization layers 624 (or 303). As discussed, devices of device layer 621 in portion 202 are decoupled from through silicon vias in portion 202 that are contacted by metallization layers 624 (or 303).

Figure 7:
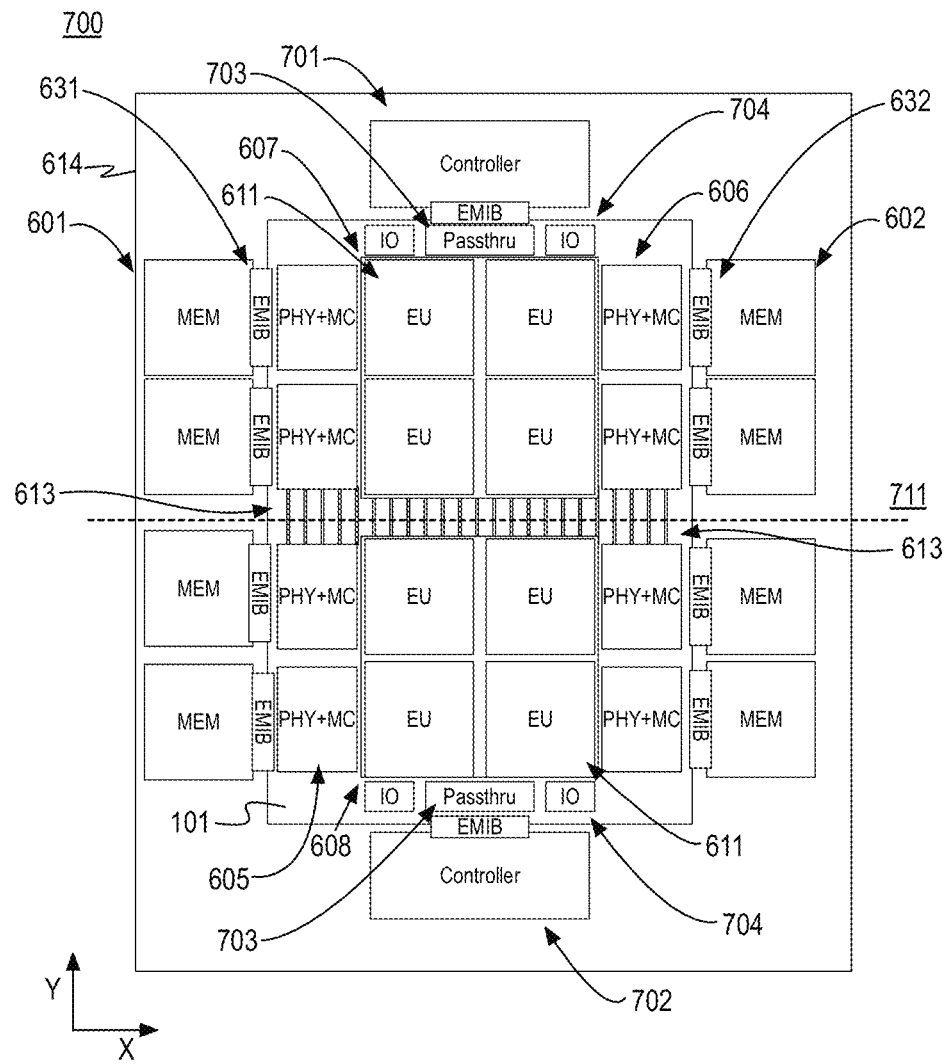
FIG. 7 provides a top down view of another exemplary compute complex employing a monolithic base die having layers selectively fabricated using reticle stitching.

FIG. 7 provides a top down view of another exemplary compute complex 700 employing monolithic base die 101 having layers selectively fabricated using reticle stitching, arranged in accordance with at least some implementations of the present disclosure. Compute complex 700 may share any characteristics or components discussed with respect to compute complex 600 and vice versa. As shown, base die 101 is mounted to package substrate 614 such that base die 101 may provide memory and compute functions such as address mapping and management, data routing, instructions routing, and so on. Memory components 601, 602 are coupled to package substrate 614 to provide memory (e.g., actual memory arrays) for compute complex 700. Base die 101 is coupled to memory components 601, 602 by embedded interconnect bridges 631, 632, respectively, which are embedded in package substrate 614. For example, memory PHY chiplets 605, 606 may provide interface to and control of memory components 601, 602 via passive interconnection through base die 101 to embedded interconnect bridges 631, 632.

As discussed, memory PHY chiplets 605, 606 are mounted on edges of base die 101 and provide interface and controls for memory components 601, 602. Memory PHY chiplets 605, 606 may also be characterized as memory controllers. Global assets chiplets 607, 608 are mounted on base die 101 and execution units 611, 612 are mounted on global assets chiplets 607, 608. As shown, compute complex 700 may include additional resources and/or interfaces. For example, compute complex 700 may include controllers 701, 702 or chips to interface with outside components connected to base die 101 through pass through connections 703 to embedded interconnect bridges. Such pass through connections 703 may be provided in a manner similar to those discussed in FIG. 6. Furthermore, I/O coupling 704 may be provided from I/O components provided on base die 101 or elsewhere in compute complex 700 to package substrate 614. As discussed, such passive coupling may be provided from microbumps on a top of base die 101, through higher level metallizations, through silicon vias, package side metal, and package side bumps directly through base die 101 and to package substrate 614.

Furthermore, compute complex 700 illustrates the mirroring simulated using the techniques disused herein. For example, compute complex 700 has substantially the same layout and resources on opposite sides of center line 711. Such mirroring and layout efficiency, using a single base die 101 is enabled by the shared through silicon via layouts fabricated at a tight pitch layer discussed herein.

For example, to emulate the mirroring and/or rotation used in multiple base die contexts, there are two classes of common regions: a first class where two different I/Os pass through collocated regions of base die 101 and a second class where one I/O passes through a region and the other collocated area has regular logic (i.e., devices). In such contexts, compute clusters are in identical places in the two regions (i.e., aligned in the center both in x- and y-), on edges of base die 101 (e.g., north and south edges or shoreline areas), it is desired to have active communication on one side and passive pass rough on the other, and on adjacent edges of base die 101 (e.g., east and west edges or sides), memory controller or other chiplets may not be centered so they may have two separate bump locations and utilized through silicon via locations for the two regions.

For the compute cluster locations, both the loose pitch and tight pitch layers of both regions are identical. For cases where two different I/Os are to pass through collocated regions, the memory controller resources (e.g., memory PHYs) may not be centered so the corresponding image or shadow of the memory controller resources is different between the two regions. For these cases, a fixed through silicon via layout is used as discussed herein such that a fixed layout or image is provided from package side bumps (bottom microbumps of base die 101), through TSVs (or through silicon vias), through silicon side bumps (top side microbumps of base die 101). in such cases, the loose metallization layers provide proper coupling between such bumps and TSVs using unique top metallization layers, package side metallization, or both. In such cases, all unused package side bumps, TSVs, silicon side bumps may be assigned to power and loose pitch layers may be deployed uniquely to ensure power islands are connected robustly. In such areas, since no devices are needed in this area, fill may be deployed (e.g., dummy devices) at tight pitch layers for the purposes of improved fabrication processing. In cases where one I/O passes through a region and the other collocated area has regular logic, one region needs passive pass through (e.g., memory controller HUB or HBM PHY or the like) and the other regions needs logic to drive communication across the reticle stitched metal lines. For the region of base die 101 providing passive pass through, the resource can select through silicon vias and microbumps as discussed above. In such regions, the active logic provided by the shared device layer patterning is unused and power savings may be achieved by running the clock to a loose pitch layer so that the clock can be tied to a unique Vss line where pass through is desired such that only a leakage penalty is paid for the devices. In some embodiments, the Vcc in this area may be isolated and tied to pin Vcc to Vss (leaving a separate Vcc to tie the Nwells) to reduce the leakage as well. In the other region of the base die, the silicon side bumps, TSVs, and package side bumps are unused and can be used to assign power such that the connection becomes active in this region.

Figure 8:
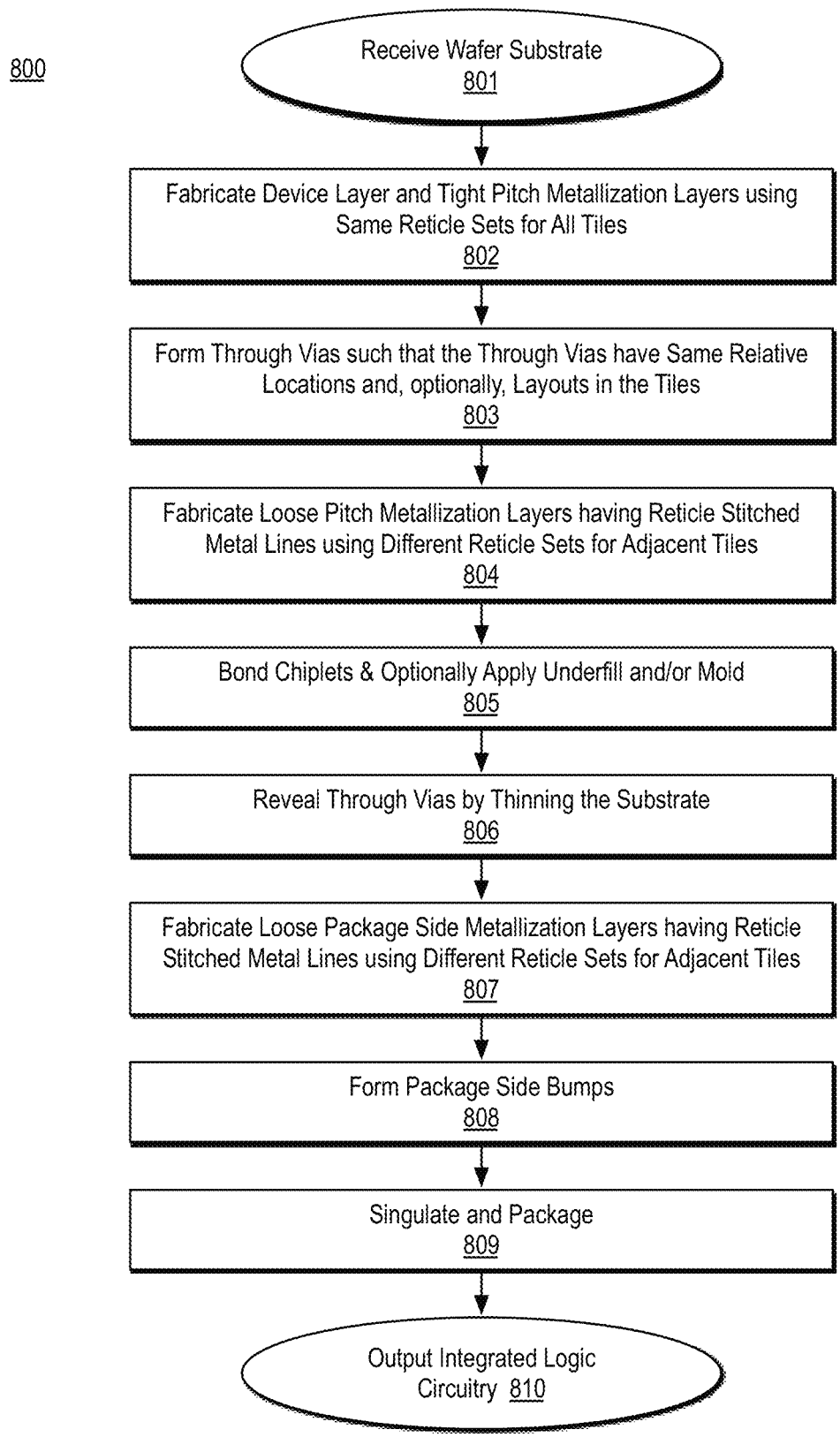
FIG. 8 is a flow diagram illustrating an example process for fabricating and packaging a monolith base die having layers selectively fabricated using reticle stitching.

FIG. 8 is a flow diagram illustrating an example process 800 for fabricating and packaging a monolith base die having layers selectively fabricated using reticle stitching, arranged in accordance with at least some implementations of the present disclosure. For example, process 800 may be implemented to fabricate device structures illustrated in FIGS. 9A-9G.

FIGS. 9A, 9B, 9C, 9D, 9E, 9F, and 9G are views of example device structures as particular fabrication operations are performed, arranged in accordance with at least some implementations of the present disclosure.

With reference to FIG. 8, process 800 begins at operation 801, where a wafer is received for processing. The wafer may include any suitable material. For example, the substrate may include a semiconductor material such as monocrystalline silicon (Si), germanium (Ge), silicon germanium (SiGe), a III-V materials based material (e.g., gallium arsenide (GaAs)), a silicon carbide (SiC), a sapphire ($Al_2O_3$), or any combination thereof. Processing continues at operation 802, where a device layer and tight pitch metallization layers are fabricated using the same reticle sets for each tile or region of the substrate wafer. The device layer and tight pitch metallization layers are fabricated using any suitable technique or techniques. Notably, such layers match between tiles or regions of the substrate wafer due to use of matching reticles for each layer. For example, a device layer and a number of tight pitched metallization layers are fabricated over adjacent first and second regions of a substrate using a shared reticle set.

Figure 9A:
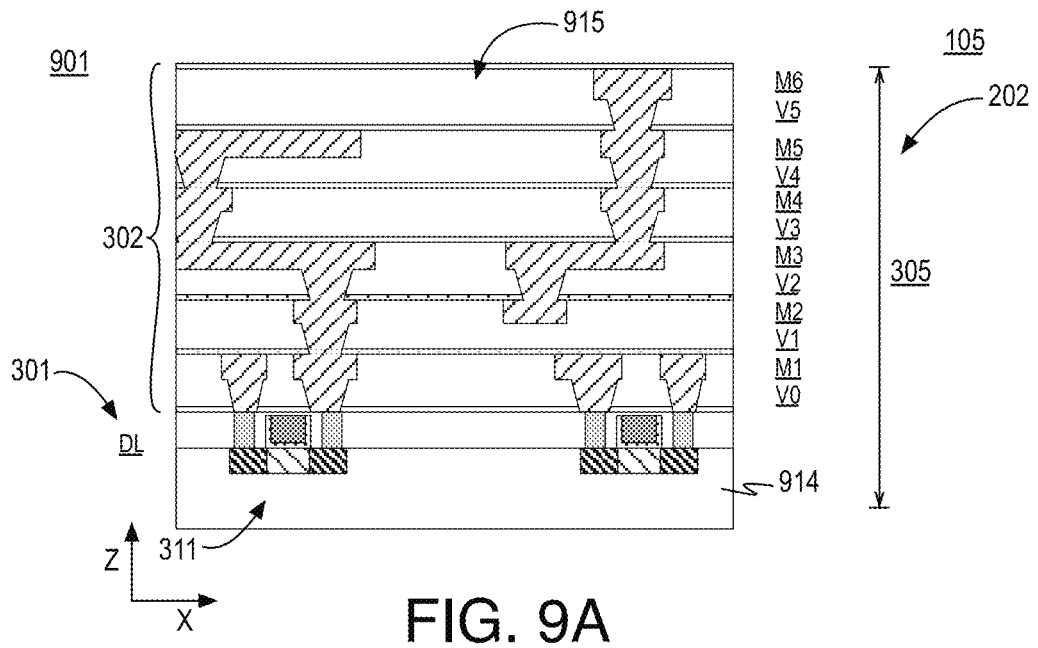

FIG. 9A illustrates a view of an example device structure 901 after the fabrication of device layer 301 and lower level metallization layers 302 (i.e., tight pitch metallization layers) over substrate 914. As discussed, substrate 914 may include any material(s) such as monocrystalline silicon, germanium, silicon germanium, a III-V materials based material (e.g., gallium arsenide), a silicon carbide, a sapphire, or the like. Notably, substrate 914 may be thinned at later operations to reveal through silicon vias. Device layer 301, inclusive of transistor 311, and lower level metallization layers 302 are fabricated using known techniques such as lithography, etch, deposition, implant, etc. As shown, device structure 901 includes a window 915 absent devices or metallization for the placement of a through silicon via that bypasses device layer 301 and lower level metallization layers 302. In FIG. 9A, portion 202 is illustrated. In addition, portion 204, matching portion 202 is fabricated using the same operations and reticle sets as discussed herein.

Returning to FIG. 8, process 800 continues at operation 803, where through silicon vias are formed using different reticles for adjacent tiles or regions of the substrate wafer. The through silicon vias are fabricated using any suitable technique or techniques such as patterning and etch techniques. Notably, the through silicon vias may have the same relative locations and, optionally layouts between tiles or regions of the substrate wafer. In some embodiments, a number of first through silicon vias are fabricated in a first portion of the first region and a matching number of second through silicon vias are fabricated in a second portion of the second region, such that the first and second through silicon vias have a same layout and same relative locations within the first and second regions, respectively. In some embodiments, the first and second portions have the same relative locations within the first and second regions, respectively, but differing through silicon via layouts due to some through silicon vias being depopulated.

Figure 9B:
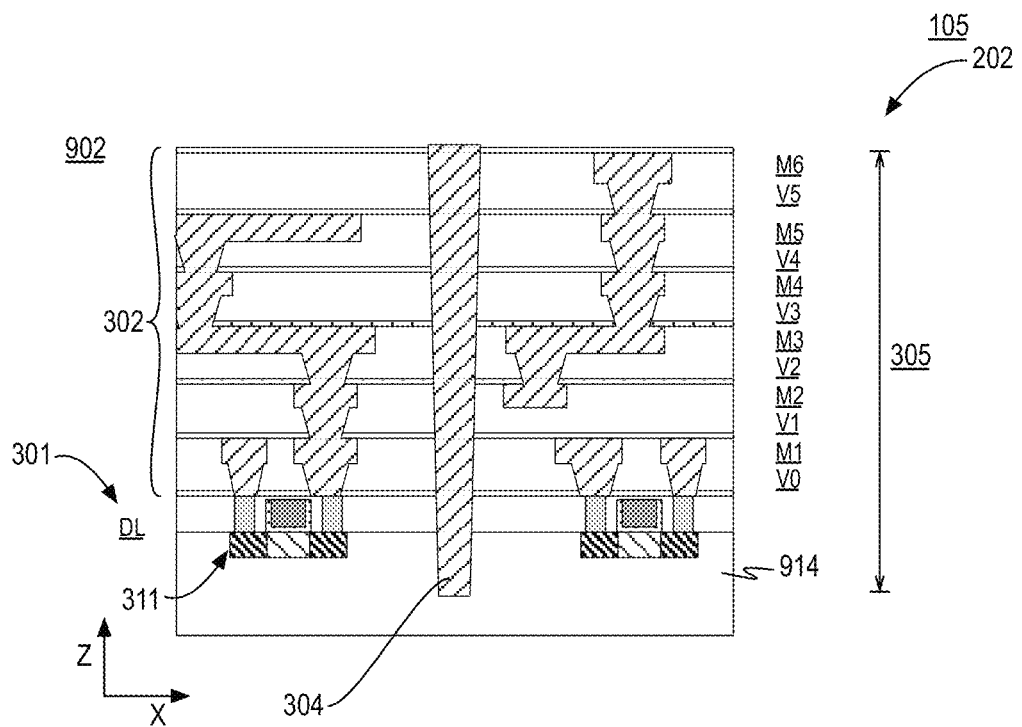

FIG. 9B illustrates a view of an example device structure 902 similar to device structure 901 after the formation of through silicon vias 304. As shown, one of through silicon vias 304 is formed within window 915 such that through silicon via bypasses device layer 301 and lower level metallization layers 302. Furthermore, through silicon vias 304 extends into substrate 914 to a depth beyond that of device layer 301. In the same or similar manner, other through silicon vias discussed herein such as through silicon vias 201, 203, 205, 207 are fabricated in portions having the same relative locations in the tiles or regions of the wafer substrate.

Returning to FIG. 8, process 800 continues at operation 804, where loose pitch metallization layers are fabricated using different reticle sets for adjacent tiles or regions such that reticle stitched metal lines are formed between adjacent tiles or regions. For example, with reference to FIG. 1, pairs of tiles or regions 105 and tiles or regions 106 are arrayed across a substrate wafer with tiles or regions 105 patterned using a first reticle set and tiles or regions 106 patterned using a second reticle set such that the patterns provide reticle stitched metal lines between tiles or regions 105 and tiles or regions 105. For example, using a first reticle set, first metallization layers having a first pattern are formed over the first through silicon vias and, using a second reticle set different than the first reticle set, second metallization layers having a second pattern are formed over the second through silicon vias. As discussed herein, the first metallization layers are coupled to a first subset of the first through silicon vias and the second metallization layers coupled to a second subset of the second through silicon vias, such that the first and second subsets do not share collocated through silicon vias. Also as discussed herein, metal lines of the first and second metallization layers connected to form reticle stitched metal lines of the monolithic base die.

Figure 9C:
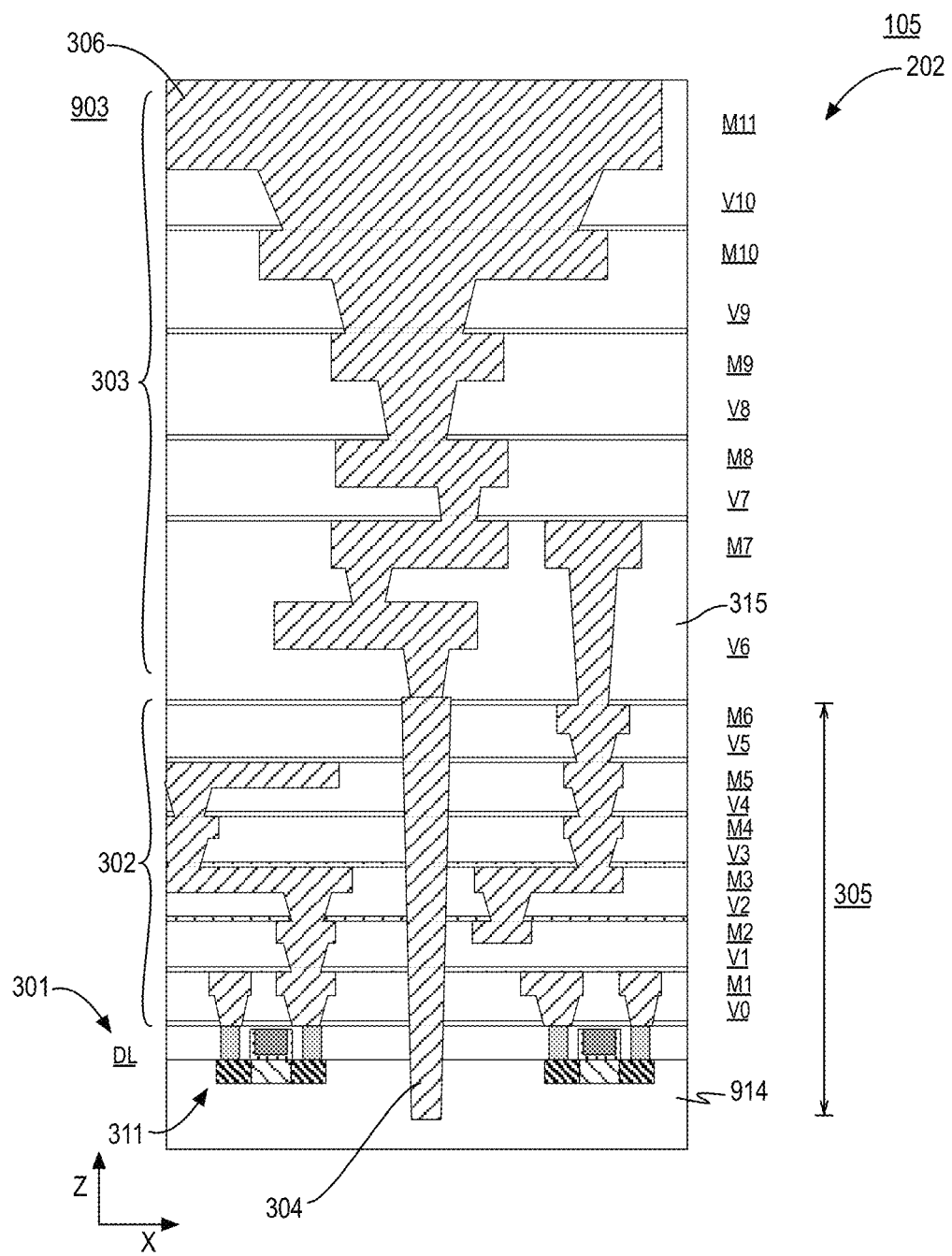

FIG. 9C illustrates a view of an example device structure 903 similar to device structure 902 after the fabrication of higher level metallization layers 303 (i.e., loose pitch metallization layers). Higher level metallization layers 303 are fabricated using known techniques such as lithography, etch, deposition, and planarization techniques inclusive of dual damascene processing techniques. In FIG. 9C, portion 202 is illustrated. In addition, portion 204 (see FIG. 4), inclusive of higher level metallization layers 403, which are different than higher level metallization layers 303, is fabricated using the same operations with different reticle sets between adjacent tiles or regions as discussed herein.

Returning to FIG. 8, process 800 continues at operation 805, where chiplets are bonded to the multi-reticle base die and optional underfill and/or mold materials are applied. For example, prior to singulation, chiplets may be bonded to the back side of the base dies (including regions 105, 106) and multi-stack complexes may be formed. In some embodiments, microbumps are formed over the higher level metallization layers and corresponding microbumps of the chiplets are bonded thereto. Optional underfill material may be applied between the bonded microbumps and/or mold material may be formed over the chiplets. Any number of chiplet stacks may be deployed such as a single level of chiplets or a multi-level chiplet stack as illustrated herein.

FIG. 9D illustrates a view of an example device structure 904 similar to device structure 903 in an expanded view after the attachment of first level chiplets 911 and second level chiplets 912, and formation of mold material 952. As shown, for each base die segment 951, including regions 105, 106, a number of first level chiplets 911 (e.g., memory PHY chiplets 605, 606 and global assets chiplets 607, 608) are attached via microbumps 604 and second level chiplets 912 (e.g., execution units 611, 612)) are attached to first level chiplets 911 via microbumps 609. Such attachment may be provided using any suitable technique or techniques such as flip chip bonding techniques, hybrid bonding techniques, etc. As discussed, underfill (not shown) may be provided between microbumps 604 and/or between microbumps 609 and mold material 952 may be applied over substrate 914 and encapsulating first level chiplets 911 and second level chiplets 912. In particular, mold material 952 may be used to attached to a support for subsequent back side reveal processing.

Returning to FIG. 8, process 800 continues at operation 806, where the through silicon vias formed at operation 803 are revealed by thinning the substrate. Such back side reveal processing may be performed using any suitable technique or techniques such as back side grind and/or back side etch techniques.

FIG. 9E illustrates a view of an example device structure 905 similar to device structure 904 after back side reveal 925 of through silicon vias 304. As shown, substrate 914 is thinned to substrate 314 using back side grind and/or back side etch techniques.

Returning to FIG. 8, process 800 continues at operation 807, where loose pitch package side metallization layers are fabricated using different reticle sets for adjacent tiles or regions such that reticle stitched metal lines are formed between adjacent tiles or regions in a manner similar to that discussed with respect to operation 804.

Figure 9F:
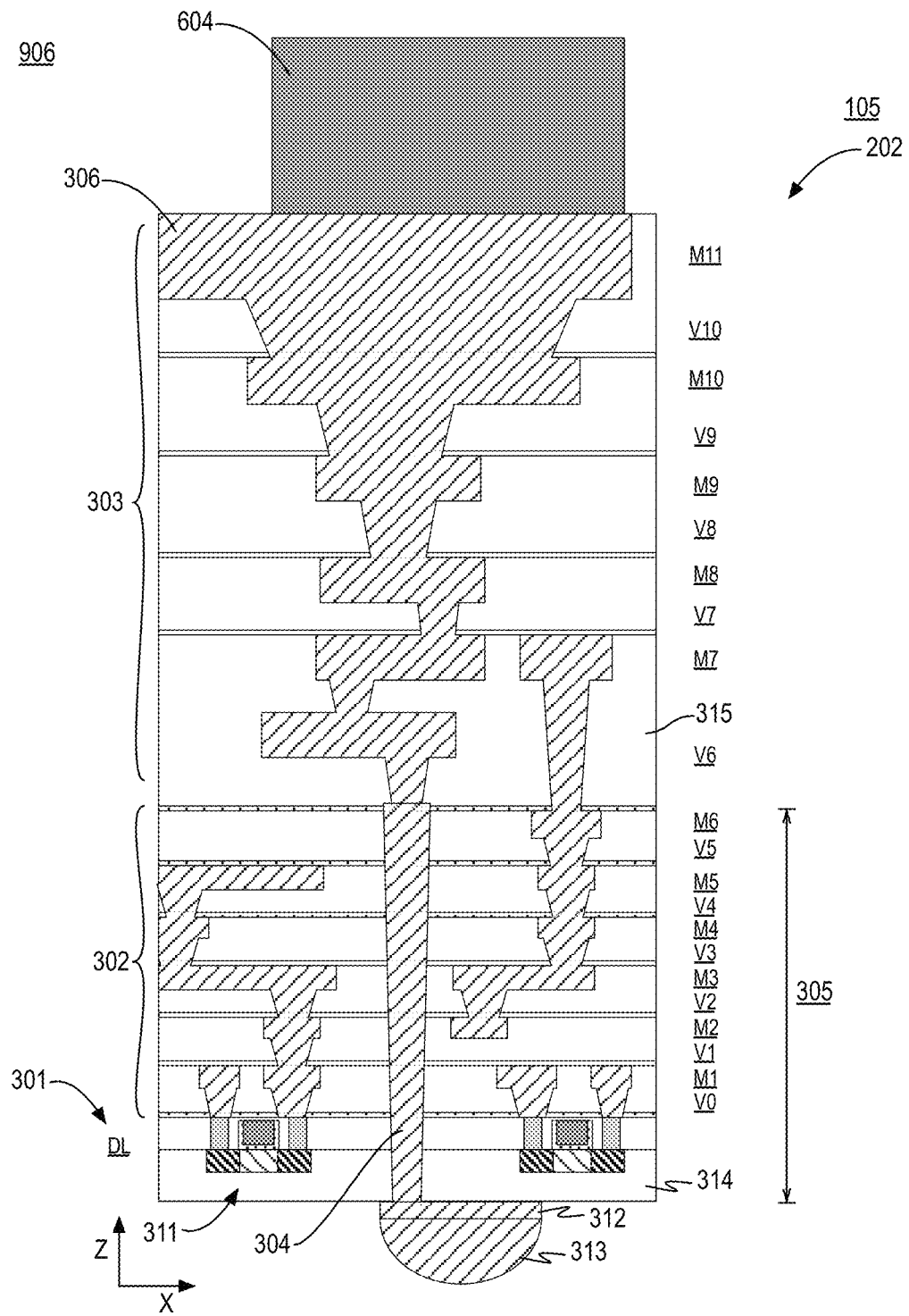

FIG. 9F illustrates a view of an example device structure 906 similar to device structure 905 in a close up partial view after the fabrication package side metallization 312 (i.e., loose pitch metallization layers). Package side metallization 312 is fabricated using known techniques such as metal deposition, lithography, and etch, techniques. In FIG. 9F, portion 202 is again illustrated. In addition, portion 204, inclusive of package side metallization 412, which is different than package side metallization 312, is fabricated using the same operations with different reticle sets between adjacent tiles or regions as discussed.

Returning to FIG. 8, process 800 continues at operation 808, where package side bumps are formed and at operation 809 where the resultant system (inclusive of the base die is singulated and packaged. The package side bumps may be formed using any suitable technique or techniques. Similarly, the singulation is performed to provide a base die inclusive of regions 105, 106. The singulated system may then be mounted to a package substrate using any suitable technique or techniques. At operation 810, the integrated logic circuitry or compute complex is output. For example, a monolithic base die including the discussed first and second regions may be segmented from a remainder of the substrate (i.e., substrate wafer). Process 800 may further include mounting the segmented base die to a package substrate having an interconnect bridge embedded therein, such that the discussed first subset of the first through silicon vias are coupled to the interconnect bridge by one or more package side bumps. For example, the first subset of the first through silicon vias may provide a passive connection from a first die (i.e., mounted to the base die) and through the base die. In some embodiments, the discussed second metallization layers are coupled to first devices of the device layer of the second region such that the first devices are to drive communication from first metal lines of the second metallization layers to second metal lines of the first metallization layers (i.e., across the reticle stitched metal lines).

Figure 9G:
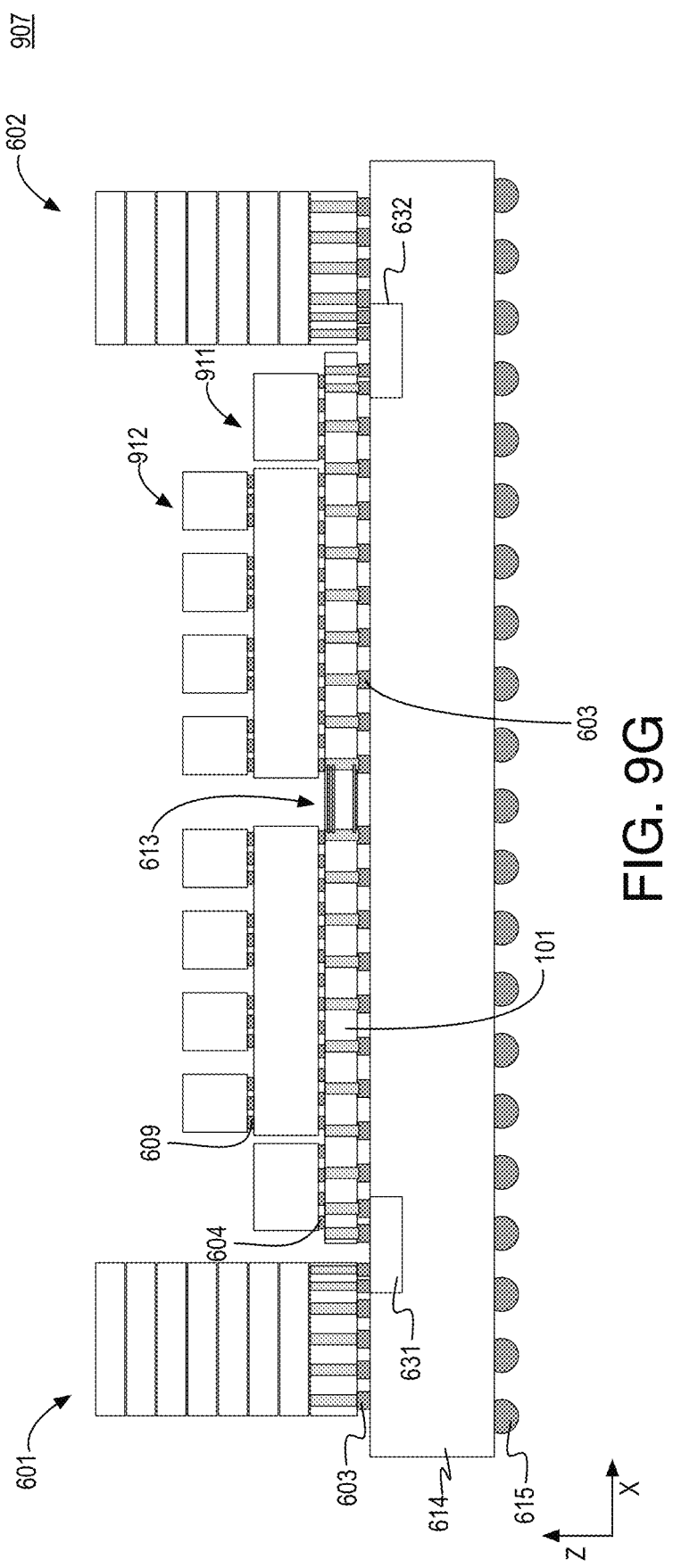

FIG. 9G illustrates a view of an example device structure 907 similar to device structure 906 in an expanded view after formation of package side bumps 603, singulation, and mounting to package substrate 614. As shown, package substrate 614 may have embedded interconnect bridges 631, 632 therein. In addition, memory components 601, 602 may be mounted to package substrate 614 to form device structure 907 similar to compute complex 600 having any characteristics discussed herein.

Figure 10:
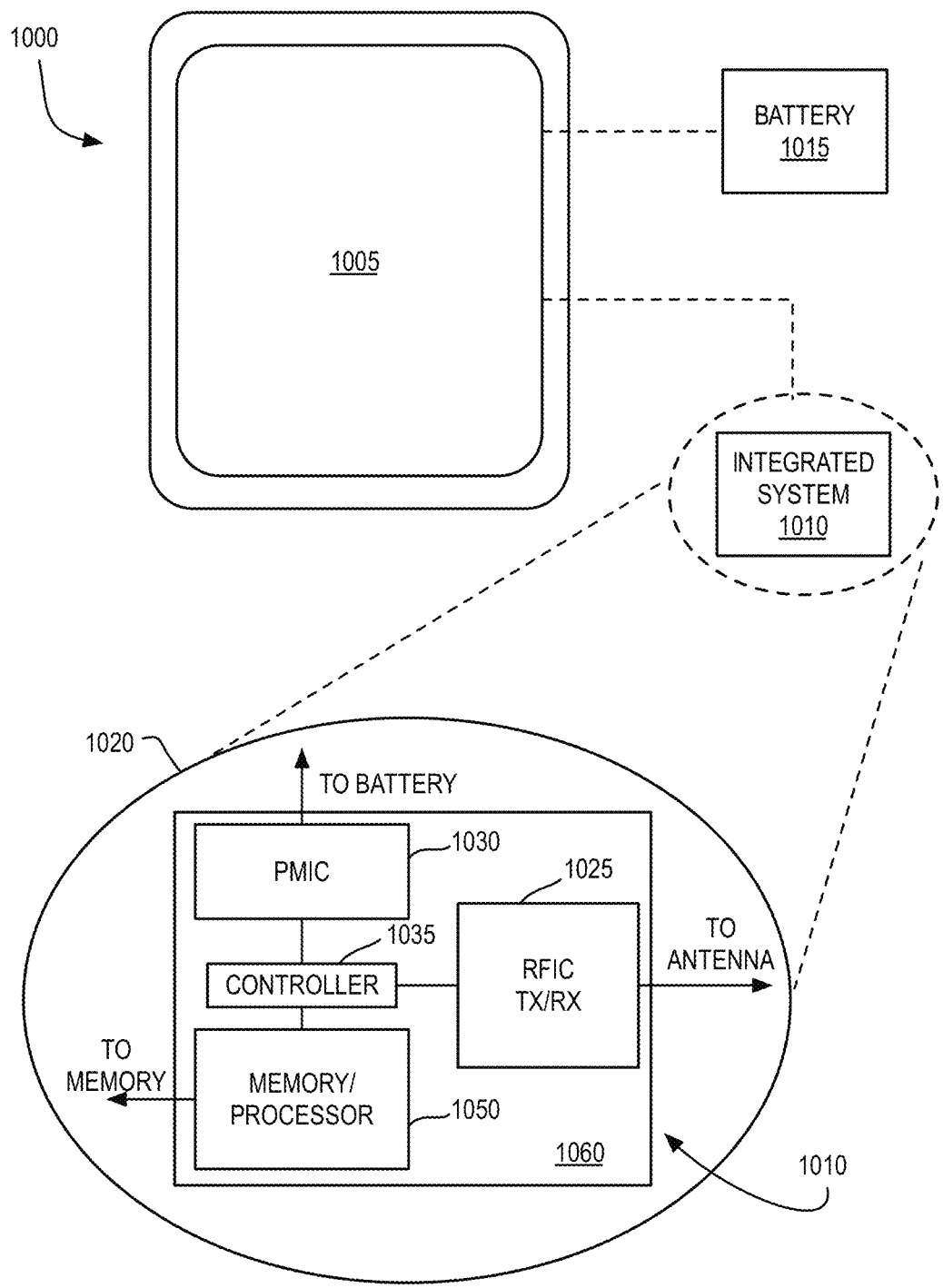
FIG. 10 is an illustrative diagram of a mobile computing platform employing a monolithic base die having layers selectively fabricated using reticle stitching.

FIG. 10 is an illustrative diagram of a mobile computing platform 1000 employing a monolithic base die having layers selectively fabricated using reticle stitching, arranged in accordance with at least some implementations of the present disclosure. Any device or structure having any components, materials, or characteristics discussed herein may be implemented by any component of mobile computing platform 1000. Mobile computing platform 1000 may be any portable device configured for each of electronic data display, electronic data processing, wireless electronic data transmission, or the like. For example, mobile computing platform 1000 may be any of a tablet, a smart phone, a netbook, a laptop computer, etc. and may include a display screen 1005, which in the exemplary embodiment is a touchscreen (e.g., capacitive, inductive, resistive, etc. touchscreen), a chip-level (system on chip—SoC) or package-level integrated system 1010, and a battery 1015. Battery 1015 may include any suitable device for providing electrical power such as a device consisting of one or more electrochemical cells and electrodes to couple to an outside device. Mobile computing platform 1000 may further include a power supply to convert a source power from a source voltage to one or more voltages employed by other devices of mobile computing platform 1000.

Integrated system 1010 is further illustrated in the expanded view 1020. In the exemplary embodiment, packaged device 1050 (labeled "Memory/Processor" in FIG. 10) includes at least one memory chip (e.g., RAM), and/or at least one processor chip (e.g., a microprocessor, a multi-core microprocessor, or graphics processor, or the like). In an embodiment, the package device 1050 is a microprocessor including an SRAM cache memory. As shown, device 1050 may employ a die or device having any transistor structures and/or related characteristics discussed herein. Packaged device 1050 may be further coupled to (e.g., communicatively coupled to) a board, a substrate, or an interposer 1060 along with, one or more of a power management integrated circuit (PMIC) 1030, RF (wireless) integrated circuit (RFIC) 1025 including a wideband RF (wireless) transmitter and/or receiver (TX/RX) (e.g., including a digital baseband and an analog front end module further comprises a power amplifier on a transmit path and a low noise amplifier on a receive path), and a controller 1035 thereof. In general, packaged device 1050 may be also be coupled to (e.g., communicatively coupled to) display screen 1005. As shown, one or both of PMIC 1030 and/or RFIC 1025 may employ a die or device having any transistor structures and/or related characteristics discussed herein.

Functionally, PMIC 1030 may perform battery power regulation, DC-to-DC conversion, etc., and so has an input coupled to battery 1015 and with an output providing a current supply to other functional modules. In an embodiment, PMIC 1030 may perform high voltage operations. As further illustrated, in the exemplary embodiment, RFIC 1025 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 1050 or within a single IC (SoC) coupled to the package substrate of the packaged device 1050.

Figure 11:
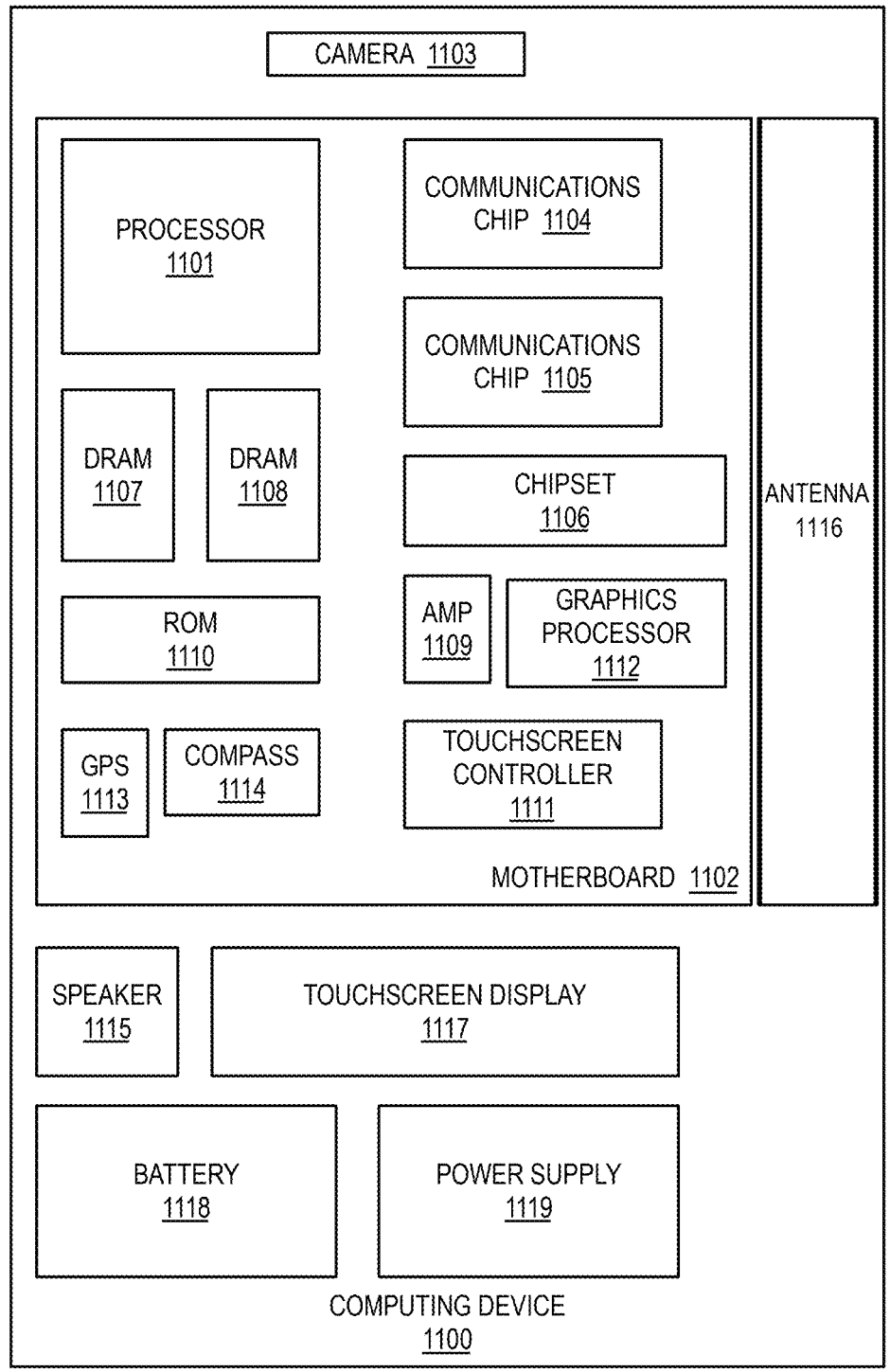
FIG. 11 is a functional block diagram of a computing device, all arranged in accordance with at least some implementations of the present disclosure.

FIG. 11 is a functional block diagram of a computing device 1100, arranged in accordance with at least some implementations of the present disclosure. Computing device 1100 may be found inside platform 1000, for example, and further includes a motherboard 1102 hosting a number of components, such as but not limited to a processor 1101 (e.g., an applications processor) and one or more communications chips 1104, 1105. Processor 1101 may be physically and/or electrically coupled to motherboard 1102. In some examples, processor 1101 includes an integrated circuit die packaged within the processor 1101. In general, the term "processor" may refer to any device or portion of a device that processes electronic data from registers and/or memory to transform that electronic data into other electronic data that may be stored in registers and/or memory. Any one or more device or component of computing device 1100 may include a base die, compute complex, or any other structure with any related characteristics discussed herein.

In various examples, one or more communication chips 1104, 1105 may also be physically and/or electrically coupled to the motherboard 1102. In further implementations, communication chips 1104 may be part of processor 1101. Depending on its applications, computing device 1100 may include other components that may or may not be physically and electrically coupled to motherboard 1102. These other components may include, but are not limited to, volatile memory (e.g., DRAM) 1107, 1108, non-volatile memory (e.g., ROM) 1110, a graphics processor 1112, flash memory, global positioning system (GPS) device 1113, compass 1114, a chipset 1106, an antenna 1116, a power amplifier 1109, a touchscreen controller 1111, a touchscreen display 1117, a speaker 1115, a camera 1103, a battery 1118, and a power supply 1119, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 1104, 1105 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1104, 1105 may implement any of a number of wireless standards or protocols, including but not limited to those described elsewhere herein. As discussed, computing device 1100 may include a plurality of communication chips 1104, 1105. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. Furthermore, power supply 1119 may convert a source power from a source voltage to one or more voltages employed by other devices or components of computing device 1100 (or mobile computing platform 1000). In some embodiments, power supply 1119 converts an AC power to DC power. In some embodiments, power supply 1119 converts an DC power to DC power at one or more different (lower) voltages. In some embodiments, multiple power supplies are staged to convert from AC to DC and then from DC at a higher voltage to DC at a lower voltage as specified by components of computing device 1100.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following embodiments pertain to further embodiments.

In one or more first embodiments, an apparatus comprises a monolithic base die comprising a first region and a second region, the first and second regions comprising shared patterns for a device layer and a plurality of first metallization layers of the first and second regions, a plurality of first through vias in a first portion of the first region and a plurality of second through vias in a second portion of the second region, the first and second through vias extending vertically across the device layer and the first metallization layers, and the first and second portions having a same relative location within the first and second regions, respectively, and one or more second metallization layers over the first through vias and one or more third metallization layers over the second through vias, the second metallization layers coupled to a first subset of the first through vias and the third metallization layers coupled to a second subset of the second through vias.

In one or more second embodiments, further to the first embodiment, the first and second through vias comprise a same layout, and continuous metal lines of the monolithic base die comprise first metal lines of the second metallization layer connected to second metal lines of the third metallization layers.

In one or more third embodiments, further to the first or second embodiments, the continuous metal lines are in a first level of the second and third metallization layers, the apparatus further comprising second continuous metal lines in a second level of the second and third metallization layers, the second continuous metal lines comprising third metal lines of the second metallization layer connected to fourth metal lines of the third metallization layers.

In one or more fourth embodiments, further to any of the first through third embodiments, the second metallization layers are coupled to a first die, the first subset of the first through vias to provide a passive connection from the first die through the base die.

In one or more fifth embodiments, further to any of the first through fourth embodiments, the third metallization layers are coupled to first devices of the device layer of the second region, the first devices to drive communication from first metal lines of the third metallization layers to second metal lines of the second metallization layers.

In one or more sixth embodiments, further to any of the first through fifth embodiments, second devices of the device layer of the first region corresponding to and having a shared pattern with the first devices of the device layer of the second region are decoupled from the first subset of the first through vias.

In one or more seventh embodiments, further to any of the first through sixth embodiments, the first subset of the first through vias are coupled to an interconnect bridge embedded in a package substrate, the base die mounted to the package substrate via a plurality of package side bumps.

In one or more eighth embodiments, further to any of the first through seventh embodiments, the first die comprises a memory controller on the base die, and the apparatus further comprises a memory component coupled to the interconnect bridge and mounted on the package substrate, a second die on the base die and coupled to the base die via interposer bumps, and an execution unit on the second die.

In one or more ninth embodiments, further to any of the first through eighth embodiments, the second die comprises crossbar memory and the execution unit is a graphics processor execution unit.

In one or more tenth embodiments, further to any of the first through ninth embodiments, the first and second subsets do not share collocated through vias, and the first portion of the first region is on a first edge of the base die and the second portion of the second region is within an interior of the base die.

In one or more eleventh embodiments, further to any of the first through tenth embodiments, the apparatus further comprises a plurality of third through vias in a third portion of the first region and a plurality of fourth through vias in a fourth portion of the second region, the third and fourth through vias extending vertically across the device layers and the first metallization layers, the third and fourth through vias having a same layout, and the third and fourth portions having a same relative location within the first and second regions, respectively.

In one or more twelfth embodiments, further to any of the first through eleventh embodiments, the first portion of the first region is on a first edge of the base die, the third portion of the first region is on a second edge of the first region within an interior of the base die, the second portion of the second region is on a third edge of the second region within the interior of the base die, and the fourth portion of the second region is on a fourth edge of the base die opposite the first edge of the base die.

In one or more thirteenth embodiments, further to any of the first through twelfth embodiments, the first and second through vias have a second same layout different than the same layout of the third and fourth through vias.

In one or more fourteenth embodiments, a system comprises a power supply and an apparatus coupled to the power supply, the apparatus according to any of the first through thirteenth embodiments.

In one or more fifteenth embodiments, a system comprises a package substrate, a monolithic base die on the package substrate, the base die comprising first and second regions comprising shared patterns for a device layer and a plurality of first metallization layers of the first and second regions, a plurality of first through vias in a first portion of the first region and a plurality of second through vias in a second portion of the second region, the first and second through vias extending through the device layers and the first metallization layers, sharing a same layout, and having a same relative location within the first and second regions, respectively, and one or more second metallization layers over the first through vias and one or more third metallization layers over the second through vias, the second metallization layers coupled to a first subset of the first through vias and the third metallization layers coupled to a second subset of the second through vias, wherein the first and second subsets do not share collocated through vias, and a power supply coupled to the package substrate.

In one or more sixteenth embodiments, further to the fifteenth embodiment, continuous metal lines of the monolithic base die comprise first metal lines of the second metallization layer connected to second metal lines of the third metallization layers.

In one or more seventeenth embodiments, further to the fifteenth or fifteenth embodiments, the second metallization layers are coupled to a first die, the first subset of the first through vias to provide a passive connection from the first die through the base die, and wherein the third metallization layers are coupled to first devices of the device layer of the second region, the first devices to drive communication from first metal lines of the third metallization layers to second metal lines of the second metallization layers.

In one or more eighteenth embodiments, further to any of the fifteenth through sixteenth embodiments, the first subset of the first through vias are coupled to an interconnect bridge embedded in a package substrate, the base die mounted to the package substrate via a plurality of package side bumps.

In one or more nineteenth embodiments, further to any of the fifteenth through seventeenth embodiments, the first portion of the first region is on a first edge of the base die and the second portion of the second region is within an interior of the base die.

In one or more twentieth embodiments, a method comprises fabricating, using a shared reticle set: a device layer and a plurality of first metallization layers in first and second regions over a substrate, forming a plurality of first through vias in a first portion of the first region and a plurality of second through vias in a second portion of the second region, the first and second through vias having a same relative locations within the first and second regions, respectively, forming, using a first reticle set, second metallization layers over the first through vias and, using a second reticle set different than the first reticle set, third metallization layers over the second through vias, and segmenting a monolithic base die comprising the first and second regions from a remainder of the substrate.

In one or more twenty-first embodiments, further to the twentieth embodiment, the first and second through vias a same layout and the second metallization layers are coupled to a first subset of the first through vias and the third metallization layers coupled to a second subset of the second through vias, wherein the first and second subsets do not share collocated through vias.

In one or more twenty-second embodiments, further to the twentieth or twenty-first embodiments, first metal lines of the second metallization layer are connected to second metal lines of the third metallization layers.

In one or more twenty-third embodiments, further to any of the twentieth through twenty-second embodiments, the first and second metal lines comprise reticle stitched metal lines of the monolithic base die.

In one or more twenty-fourth embodiments, further to any of the twentieth through twenty-third embodiments, the method further comprises mounting the base die to a package substrate having an interconnect bridge embedded therein, wherein the first subset of the first through vias of the base die are coupled to the interconnect bridge by one or more package side bumps, the first subset of the first through vias to provide a passive connection from a first die and through the base die.

In one or more twenty-fifth embodiments, further to any of the twentieth through twenty-fourth embodiments, the third metallization layers are coupled to first devices of the device layer of the second region, the first devices to drive communication from first metal lines of the third metallization layers to second metal lines of the second metallization layers.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An apparatus, comprising:
a monolithic base die comprising a first region and a second region, the first and second regions comprising shared patterns for a device layer and a plurality of first metallization layers of the first and second regions;
a plurality of first through vias in a first portion of the first region and a plurality of second through vias in a second portion of the second region, the first and second through vias extending vertically across the device layer and the first metallization layers, and the first and second portions having a same relative location within the first and second regions, respectively; and
one or more second metallization layers over the first through vias and one or more third metallization layers over the second through vias, the second metallization layers coupled to a first subset of the first through vias and the third metallization layers coupled to a second subset of the second through vias.

2. The apparatus of claim 1, wherein the first and second through vias comprise a same layout, and continuous metal lines of the monolithic base die comprise first metal lines of the second metallization layer connected to second metal lines of the third metallization layers.

3. The apparatus of claim 2, wherein the continuous metal lines are in a first level of the second and third metallization layers, the apparatus further comprising second continuous metal lines in a second level of the second and third metallization layers, the second continuous metal lines comprising third metal lines of the second metallization layer connected to fourth metal lines of the third metallization layers.

4. The apparatus of claim 1, wherein the second metallization layers are coupled to a first die, the first subset of the first through vias to provide a passive connection from the first die through the base die.

5. The apparatus of claim 4, wherein the third metallization layers are coupled to first devices of the device layer of the second region, the first devices to drive communication from first metal lines of the third metallization layers to second metal lines of the second metallization layers.

6. The apparatus of claim 5, wherein second devices of the device layer of the first region corresponding to and having a shared pattern with the first devices of the device layer of the second region are decoupled from the first subset of the first through vias.

7. The apparatus of claim 4, wherein the first subset of the first through vias are coupled to an interconnect bridge embedded in a package substrate, the base die mounted to the package substrate via a plurality of package side bumps.

8. The apparatus of claim 7, wherein the first die comprises a memory controller on the base die, the apparatus further comprising:
- a memory component coupled to the interconnect bridge and mounted on the package substrate;
- a second die on the base die and coupled to the base die via interposer bumps; and
- an execution unit on the second die.

9. The apparatus of claim 8, wherein the second die comprises crossbar memory and the execution unit is a graphics processor execution unit.

10. The apparatus of claim 1, wherein the first and second subsets do not share collocated through vias, and the first portion of the first region is on a first edge of the base die and the second portion of the second region is within an interior of the base die.

11. The apparatus of claim 1, further comprising:
- a plurality of third through vias in a third portion of the first region and a plurality of fourth through vias in a fourth portion of the second region, the third and fourth through vias extending vertically across the device layers and the first metallization layers, the third and fourth through vias having a same layout, and the third and fourth portions having a same relative location within the first and second regions, respectively.

12. The apparatus of claim 11, wherein the first portion of the first region is on a first edge of the base die, the third portion of the first region is on a second edge of the first region within an interior of the base die, the second portion of the second region is on a third edge of the second region within the interior of the base die, and the fourth portion of the second region is on a fourth edge of the base die opposite the first edge of the base die.

13. The apparatus of claim 11, wherein the first and second through vias have a second same layout different than the same layout of the third and fourth through vias.

14. A system, comprising:
- a package substrate;
- a monolithic base die on the package substrate, the base die comprising:
  - first and second regions comprising shared patterns for a device layer and a plurality of first metallization layers of the first and second regions;
  - a plurality of first through vias in a first portion of the first region and a plurality of second through vias in a second portion of the second region, the first and second through vias extending through the device layers and the first metallization layers, sharing a same layout, and having a same relative location within the first and second regions, respectively; and
  - one or more second metallization layers over the first through vias and one or more third metallization layers over the second through vias, the second metallization layers coupled to a first subset of the first through vias and the third metallization layers coupled to a second subset of the second through vias, wherein the first and second subsets do not share collocated through vias; and
- a power supply coupled to the package substrate.

15. The system of claim 14, wherein continuous metal lines of the monolithic base die comprise first metal lines of the second metallization layer connected to second metal lines of the third metallization layers.

16. The system of claim 14, wherein the second metallization layers are coupled to a first die, the first subset of the first through vias to provide a passive connection from the first die through the base die, and wherein the third metallization layers are coupled to first devices of the device layer of the second region, the first devices to drive communication from first metal lines of the third metallization layers to second metal lines of the second metallization layers.

17. The system of claim 16, wherein the first subset of the first through vias are coupled to an interconnect bridge embedded in a package substrate, the base die mounted to the package substrate via a plurality of package side bumps.

18. The system of claim 14, wherein the first portion of the first region is on a first edge of the base die and the second portion of the second region is within an interior of the base die.

* * * * *